(12) United States Patent
Martinelli et al.

(10) Patent No.: US 11,217,291 B2
(45) Date of Patent: Jan. 4, 2022

(54) CIRCUITRY BORROWING FOR MEMORY ARRAYS

(71) Applicant: Micron Technology, Inc., Boise, ID (US)

(72) Inventors: Andrea Martinelli, Bergamo (IT); Francesco Mastroianni, Melzo (IT); Kiyoshi Nakai, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 16/508,772

(22) Filed: Jul. 11, 2019

(65) Prior Publication Data

US 2021/0012825 A1 Jan. 14, 2021

(51) Int. Cl.
*G11C 7/08* (2006.01)
*G11C 7/12* (2006.01)
(Continued)

(52) U.S. Cl.
CPC ............ *G11C 11/2255* (2013.01); *G11C 7/08* (2013.01); *G11C 7/109* (2013.01); *G11C 7/1063* (2013.01);
(Continued)

(58) Field of Classification Search
CPC .............. G11C 11/2255; G11C 11/221; G11C 11/4091; G11C 11/2259; G11C 11/4087; G11C 11/2273; G11C 7/08; G11C 7/1063; G11C 7/109; G11C 7/12; G11C 29/74; G11C 29/802; G11C 29/806; G11C 5/025; G11C 29/52; G11C 11/2253; G11C 11/2297
See application file for complete search history.

(56) References Cited

U.S. PATENT DOCUMENTS 6,026,052 A * 2/2000 Fukutani .................. G11C 8/18
365/226
6,459,642 B1 * 10/2002 Cho ......................... G11C 5/14
365/200
(Continued)

OTHER PUBLICATIONS

ISA/KR, International Search Report and Written Opinion of the International Searching Authority, Int'l Appl. No. PCT/US2020/040915, dated Oct. 26, 2020, Korean Intellectual Property Office, Seo-gu, Daejeon, Republic of Korea, 14 pgs.

*Primary Examiner* — Jay W. Radke
(74) *Attorney, Agent, or Firm* — Holland & Hart LLP

(57) ABSTRACT

Methods, systems, and devices for circuitry borrowing in memory arrays are described. In one example, a host device may transmit an access command associated with data for a first memory section to a memory device. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed based on operating the first set of circuitry and the second set of circuitry.

24 Claims, 8 Drawing Sheets

(51) Int. Cl.
*G11C 11/22* (2006.01)
*G11C 11/4091* (2006.01)
*G11C 11/408* (2006.01)
*G11C 7/10* (2006.01)

(52) U.S. Cl.
CPC .............. *G11C 7/12* (2013.01); *G11C 11/221* (2013.01); *G11C 11/2259* (2013.01); *G11C 11/2273* (2013.01); *G11C 11/4087* (2013.01); *G11C 11/4091* (2013.01)

(56) References Cited

U.S. PATENT DOCUMENTS

| | | | |
|---|---|---|---|
| 2008/0084729 A1* | 4/2008 | Cho | G11C 8/08 365/72 |
| 2010/0128549 A1 | 5/2010 | Dudeck et al. | |
| 2011/0317463 A1 | 12/2011 | Maejima | |
| 2012/0063194 A1* | 3/2012 | Baek | H01L 27/2481 365/148 |
| 2012/0063208 A1* | 3/2012 | Koyama | G11C 11/407 365/149 |
| 2013/0044550 A1 | 4/2013 | Jung et al. | |
| 2015/0332740 A1 | 11/2015 | Venkata | |
| 2018/0068700 A1 | 3/2018 | Wang et al. | |

* cited by examiner

CIRCUITRY BORROWING FOR MEMORY ARRAYS

BACKGROUND

The following relates generally to a system that includes at least one memory device and more specifically to circuitry borrowing for memory arrays within a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

A memory device may include a memory array, which may further include multiple subarrays. In some cases, the memory array may include circuitry associated with input, output, and other operations for exchanging or interpreting information of various memory cells in the subarrays. Memory devices may have various constraints for locating such circuitry in a memory array.

DETAILED DESCRIPTION

Figure 1:
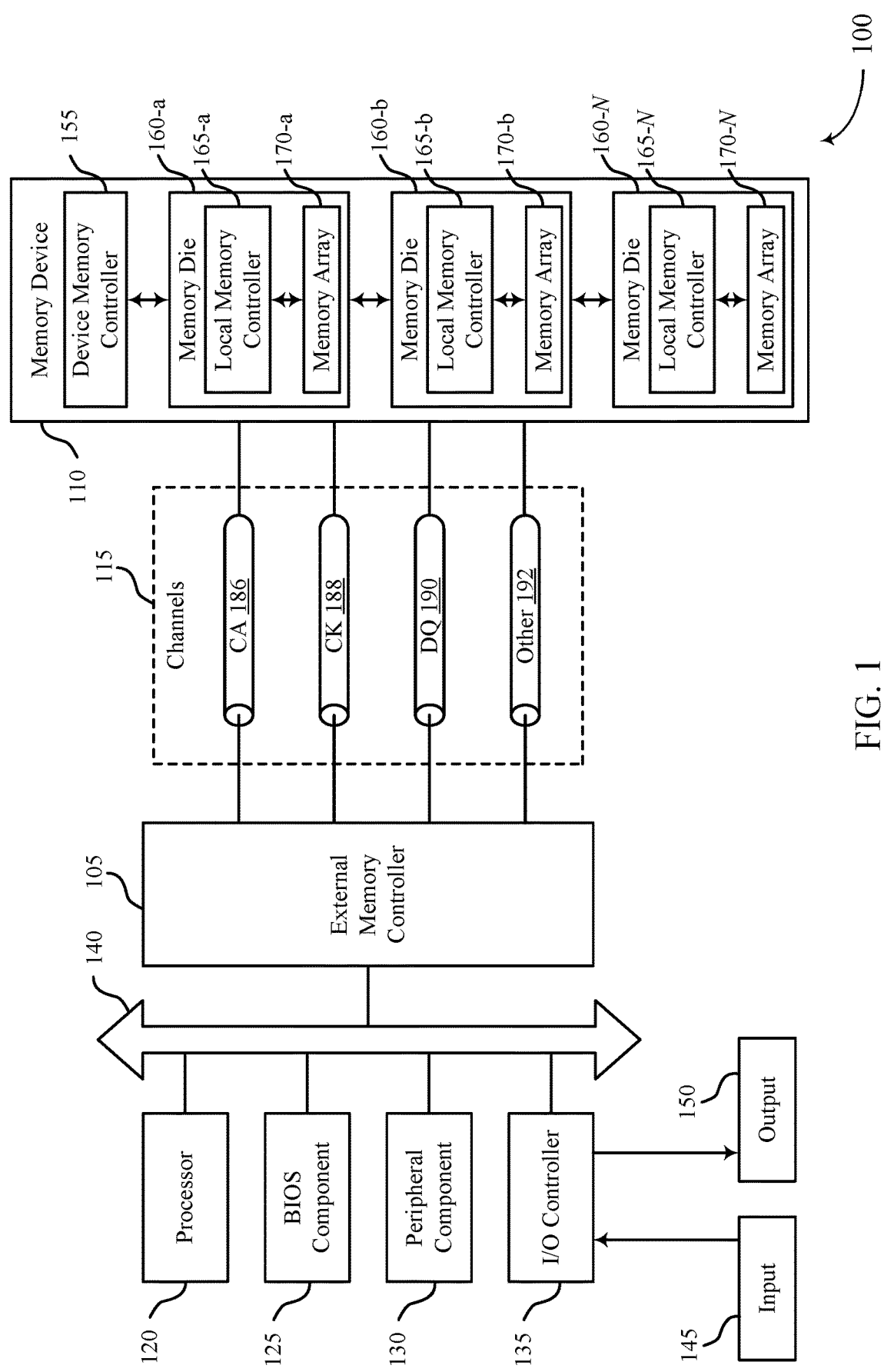
FIG. 1 illustrates an example of a system that supports circuitry borrowing for memory arrays in accordance with examples as disclosed herein.

Systems and techniques related to circuitry borrowing for a memory device are described. For example, a memory device may include a plurality of memory tiles (e.g., patches), where each of the memory tiles includes an array layer and a circuit layer. For each memory tile, the array layer may include a plurality of memory cells and the circuit layer may include circuitry corresponding to operating the plurality of memory cells of the array layer, such as decoding circuitry, multiplexing circuitry, driver circuitry, sensing circuitry, or other circuitry that is specific to the memory tile. The memory device may also include data path circuitry that is shared by the plurality of memory tiles (e.g., corresponding to operating the plurality of memory tiles, corresponding to data exchange between the plurality of memory tiles and an input/output component), and is distributed across the circuit layer of two or more memory tiles of the plurality of memory tiles. Thus, in some examples, a memory device may include various types of circuitry that are distributed across circuit layers of a plurality of memory tiles, where tile-specific circuitry is included in the circuit layer of a corresponding memory tile, and data path circuitry is distributed across the remaining space of the circuit layer of the memory tiles (e.g., in space of the circuit layer not occupied by tile-specific circuitry).

In some cases, memory tiles within array may be organized into groups for concurrent access, and such groups may be referred to as banks or sections. For example, tiles may be organized into rows and columns within the memory array (which may, in some cases, be referred to as a quilt architecture), and a row of tiles within the array may be referred to as a section. In some cases, there are circuits (e.g., circuits that control the timing of sense components) that may be shared or "borrowed" by neighboring memory tiles (either within a same section, or across sections (e.g., by tiles within neighboring sections)). For example, when memory cells within different tiles of a section are accessed at the same time, common circuitry be used to operate neighboring tiles within the section. Additionally or alternatively, circuitry used to operate a first section when the first section is accessed may also be used to operate a second section (e.g., a second section adjacent to the first section) when the second section is accessed. Thus, circuitry may be borrowed or shared between (e.g., common to) tiles within a same section, and also sections within a same array.

Control signal drivers are used to drive shared circuitry in a given section. For example, control signal drivers may control the timing signals of sense amplifiers or other circuitry that may be shared across section boundaries. The control signal drivers may be located under a section or at a memory tile "bottom side." In some cases, at an edge of an array of memory tiles, a full set of control signal drivers (e.g., two sets of drivers) may be positioned to control all the signals in the memory tiles at or near the edge, and no drivers are positioned at the other edge of the array of memory tiles. Using multiple control signal drivers of a shared circuitry on an edge of an array can compromise spacing, and ultimately, affect die size.

In accordance with the techniques disclosed herein, a memory array may have sets of shared circuitry for memory sections which include some control signals borrowed from a memory section above (e.g., in a first adjacent row of tiles)

and some control signals borrowed from a memory section below (e.g., in a second adjacent row of tiles). The memory array may include multiple sections and multiple sets of shared circuitry. Each set of shared circuitry may be shared by two memory sections. Each section may have a set of drivers, and the drivers may be split into two groups (or types).

For example, for a first section, drivers of a first type may be used by a set of shared circuitry that is shared by the first section and a second section located above the first section. Drivers of a second type may be used by a set of shared circuitry that is shared by the first section and a third section located below the first section. As a result, there are no longer two sets of drivers at the edge of the memory array (e.g., there may be only one driver or set of drivers at both of two edges) and space is saved in the edge memory tiles.

Features of the disclosure are initially described in the context of a memory system and memory die as described with reference to FIGS. 1 through 3. Features of the disclosure are described in the context of circuitry borrowing for a memory array as described with reference to FIG. 4. These and other features of the disclosure are further illustrated by and described with reference to apparatus diagrams and flowcharts that relate to circuitry borrowing for memory arrays as described with references to FIGS. 5-8.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some cases, the host device may transmit, to the memory device 110, an access command associated with data for a first memory section. The first memory section may include a respective set of subarrays (e.g., tiles, patches) of the memory device 110. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed on the first memory section based on operating the first set of circuitry and the second set of circuitry. Such a pattern of sections, shared circuitry, and driver borrowing may be repeated across any number of memory sections. The host device may receive the data for the first subarray or tile based on coupling a first sense component, or portion thereof, with a first I/O line or bus and a second sense component, or portion thereof, with a second I/O line or bus.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some cases, the components of the system 100 (e.g., a memory device 110) may include sense components, I/O buses or lines, drivers, or shunts, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may include multiple memory sections and memory tiles as described herein. A memory array 170 may be a collection (e.g., a grid) of memory cells, with each memory cell being configured to store at least one bit of digital data. Features of memory arrays 170 and/or memory cells are described in more detail below, including with reference to FIG. 2.

In various examples, a device memory controller 155 of a memory device 110, or one or more local memory controllers 165 of a memory device 110, may be considered as or perform operations associated with an input/output component of the memory device 110 (e.g., for communication of information associated with access commands). In some examples, the memory device 110 may receive an access command associated with data of the memory device 110. In some cases, the memory device 110 may receive (e.g., prior to receiving the access command) an activation command that indicates an address range (e.g., a range of column addresses) for the access command as corresponding to only a subset of subarrays within a bank of the memory device. In some cases, the memory device 110 may also receive (e.g., prior to receiving the activation command) a command to operate the memory device 110 according to a power mode or configuration, such as a reduced power mode. When operating in the reduced power mode, the memory device 110 may be configured to activate only the indicated subset of the subarrays within the target bank (and to leave deactivated other subarrays within the target bank). The memory device 110 may thus, while executing the access operation on one portion of the target bank, place in or otherwise maintain in a deactivated mode other portions of the target bank, thereby conserving power, among other benefits.

In some examples, the memory device 110 may receive an access command associated a first memory section of the memory device 110. The first memory section may be located between a second memory section and a third memory section. The device memory controller 155 may be coupled with sets of drivers and provide control signals to each set of drivers for sets of shared circuitry common to respective memory sections. For example, a first set of circuitry may be shared by the first memory section and the second memory section using drivers associated with the first memory section and drivers associated with the second memory section. A second set of circuitry shared by the first memory section and the third memory section using drivers associated with the first memory section and drivers associated with the third memory section. An access operation may be performed associated with data for the first section based at least in part on operating the first set of circuitry and operating the second set of circuitry.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, or software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

The components of the system 100 may exchange information with the memory device 110 using a plurality of channels 115. In some examples, the channels 115 may enable communications between the external memory controller 105 and the memory device 110. Each channel 115 may include one or more signal paths or transmission media (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (e.g., including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a memory die 160 may include one or memory arrays 170, and a memory array 170 may include a plurality of memory tiles. In some cases, memory tiles within a memory array 170 may be organized into groups for concurrent access, and such groups may be referred to as banks or sections. In some cases, memory tiles may be organized into rows and columns within the memory array 170, which may, in some cases, be referred to as a quilt architecture, and a row of the memory array 170 may be a section. Each of the memory tiles may include an array layer and a circuit layer. For each memory tile, the array layer may include a plurality of memory cells (e.g., a subarray, a portion of a memory array 170) and the circuit layer may include circuitry corresponding to (e.g., dedicated to, specific to, primarily assigned to) the plurality of memory cells of the array layer, such as decoding circuitry, multiplexing circuitry, driver circuitry, sensing circuitry, or other circuitry that is specific to the memory tile (though, in some cases, circuitry that is specific to the memory tile may be accessible by one or more neighboring tiles via multiplexing or other switching circuitry, along with one or more interconnections). The memory device may also include data path circuitry that is shared by the plurality of memory tiles (e.g., corresponding to operating the bank of memory tiles, corresponding to data exchange between the bank of memory tiles and a local memory controller 165, available to multiple memory tiles and selectively used for one or more of the multiple memory tiles at a time), and is distributed across the circuit layer of two or more memory tiles of the plurality of memory tiles (e.g., the circuit layers of all of the plurality of memory tiles, the circuit layers of a subset of the plurality of memory tiles). In some cases, sets of shared circuitry may include sets of data path circuitry configured to transfer information associated with access operations for memory cells in a respective first memory section and for memory cells in a respective second memory section. Thus, in some examples, a memory die 160 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across remaining space of the circuit layer of the memory tiles (e.g., in spaces of the circuit layers not occupied by tile-specific circuitry). In some examples, one or more local I/O lines may be shared between memory tiles, which may support various techniques for selectively activating and deactivating (e.g., maintaining as deactivated) subsets of memory tiles to support various page size modes or reduced power modes.

Figure 2:
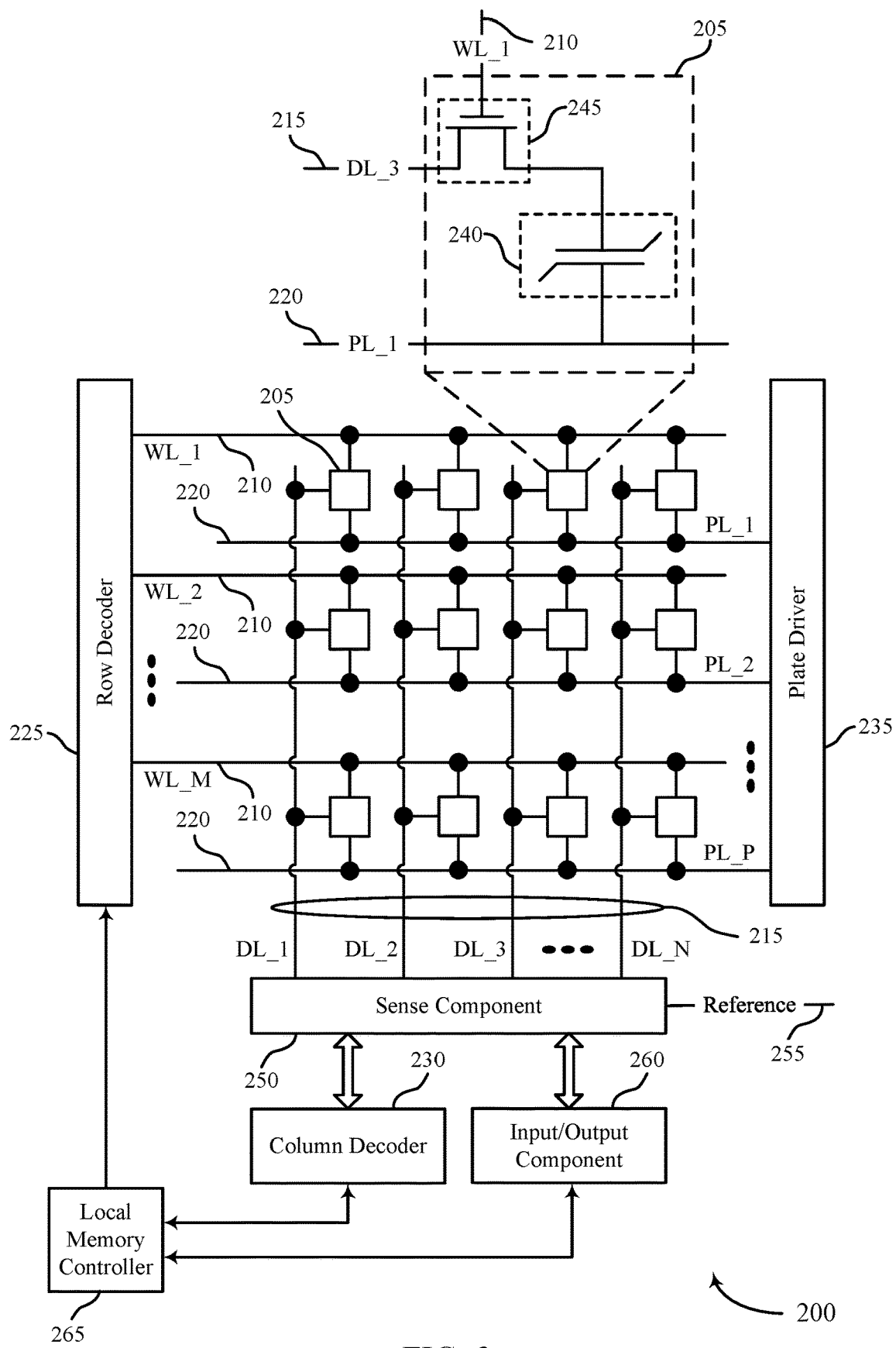
FIG. 2 illustrates an example of a memory die that supports circuitry borrowing for memory arrays in accordance with examples as disclosed herein.

FIG. 2 illustrates an example of aspects of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 and a logic 1). In some cases, a single memory cell 205 (e.g., a multi-level memory cell) may be configured to store more than one bit of information at a time (e.g., a logic 00, logic 01, logic 10, or a logic 11). In some examples, the memory cells 205 of the memory die 200 may include a plurality of memory sections, where each of the sections includes or otherwise corresponds to a plurality of tiles or patches.

A memory cell 205 may store a state (e.g., polarization state or dielectric charge) that represents digital data. In FeRAM architectures, the memory cell 205 may include a capacitor 240 that includes a ferroelectric material to store a charge and/or a polarization representative of the programmable state. In DRAM architectures, the memory cell 205 may include a capacitor 240 that includes a dielectric material to store a charge representative of the programmable state. In other memory architectures, a memory die 200 in accordance with the described techniques may implement other types of memory elements or storage elements. For example, a memory die 200 may include memory cells 205 with a configurable material memory element (e.g., in place of the illustrated capacitor 240) that stores a logic state as a material property of the material memory element. Such material properties may include a programmable resistance (e.g., for a phase change material memory element that can be programmed with different resistances, in a PCRAM application), a programmable threshold voltage (e.g., for a material memory element that can be programmed with different threshold voltages, such as by write operations with different current pulse duration, amplitude, or polarity), and other characteristics that can be selectively programmed to store a logic state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed.

The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

A memory device that includes the memory die 200 may receive an access command (e.g., from a host device). In some cases, an access command may indicate an address range for the access command as corresponding to a first subarray of the memory die 200. In such cases, the access command may be associated with data for the first subarray. The sense component 250, or portions thereof, may be coupled with components of the memory die 200 based on receiving the access command and sense logic states stored by memory cells 205.

In some cases, an access command may indicate an address range for the access command as corresponding to one or more subarrays of the memory die 200 (e.g., as corresponding to a memory section of the memory die 200). In such cases, the access command may be associated with data for the memory section. A host device may transmit an access command associated with data for a first memory section. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed based on operating the first set and the second set of circuitry. The sense component 250, or portions thereof, may be coupled with the first set of circuitry and the second set of circuitry based on receiving the access command and sense logic states stored by memory cells.

The memory cell 205 may include a logic storage component, such as capacitor 240 or other storage element or memory element (e.g., a configurable material), and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. However, in various examples, memory architectures that support the described techniques may or may not include a switching component 245 as part of, or otherwise associated with a respective memory cell 205. In some cases, plate lines 220 may be coupled with a cell plate reference voltage, such as Vpl, or may be a ground or chassis ground voltage, such as Vss. In some cases, plate lines 220 may refer to a plate or electrical node that is common to all of the memory cells 205, or a plate or electrical node that is common to a subset of the memory cells 205 or a subset of plate lines, or another electrical node coupled with a plate line driver.

Selecting or deselecting the memory cell 205 may be accomplished by activating or deactivating the switching component 245, or otherwise activating relevant access lines. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be relatively small, in some cases. As such, the sense component 250 may include one or more sense amplifiers to amplify the signal output of the memory cell 205. The sense amplifiers may detect small changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output component 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The sense component 250 may include any number of sense amplifiers. A sense amplifier may be configured to sense data from a respective memory tile as well as one or more neighbor memory tile. For example, the sense amplifier may be included in a circuit layer of the respective memory tile, and may be configured to be coupled with memory cells in an array layer of the respective memory tile, but (e.g., via multiplexing or other switching circuitry or interconnections) may also be configured to be coupled with memory cells included in an adjacent memory tile, where the adjacent memory tile may be in the same section or a different section than the respective memory tile. For example, the sense component 250, or a portion thereof, may be configured to sense data from a first subarray of the memory die 200 or a second subarray of the memory die 200 based on an activation command that indicates an address range for the access command as corresponding to the first subarray or the second subarray. In such cases, the sense component 250 may be activated. In some cases, the sense component 250 may be deactivated based on the access command corresponding to the first subarray or the second subarray of the memory die 200.

The detected logic state of the memory cell 205 may be provided as an output of the sense component 250 (e.g., to an input/output component 260), which may be used to indicate the detected logic state to another component of a memory device 110 that includes the memory die 200, such as a device memory controller 155 (e.g., directly or using the local memory controller 265). The input/output component 260, or other component between the sense component 250 and the input/output component 260, may include various components or circuitry that support the communication of information between memory cells 205 (e.g., by way of the sense component 250, sense amplifiers of the sense component 250) and the local memory controller 265. Such components or circuitry may be referred to as data path circuitry, and may support operations such as signal amplification, redundancy, error detection, error correction, and other operations.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform or control a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform or control a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 (e.g., a sense amplifier of the sense component 250) may amplify the signal. The local memory controller 265 may fire the sense component 250 (e.g., latch a sense amplifier of the sense component 250) and thereby compare the signal received from the memory cell 205 to the reference signal 255. Based on that comparison, the sense component 250 may determine a logic state that is stored on the memory cell 205. In some examples, the local memory controller 265 may communicate the logic state stored on the memory cell 205 to an external memory controller 105 or a device memory controller 155 as part of the read operation. In some examples, other operations may be performed between sensing a logic state of a memory cell 205 and communicating information to or from an external memory controller 105 or device memory controller 155 (e.g., by the input/output component 260), such as signal amplification, redundancy operations, or error correction operations.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some examples, the memory die 200 may include a plurality of memory tiles or patches, where each of the memory tiles of the memory die 200 includes an array layer and a circuit layer. For each memory tile, the array layer may include a plurality of memory cells 205 and the circuit layer may include circuitry corresponding to (e.g., dedicated to, specific to, primarily assigned to) the plurality of memory cells of the array layer, such as decoding circuitry, sensing circuitry, or other circuitry that is specific to the memory tile (e.g., of a row decoder 225, of a column decoder 230, of a sense component 250). The memory device may also include data path circuitry (e.g., of an input/output component 260, of a local memory controller 265) that is shared by the plurality of memory tiles and is distributed across the circuit layer of two or more memory tiles of the plurality of memory tiles. Thus, in some examples, the memory die 200 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across the memory tiles (e.g., in space of the circuit layer not occupied by tile-specific circuitry).

Figure 3:
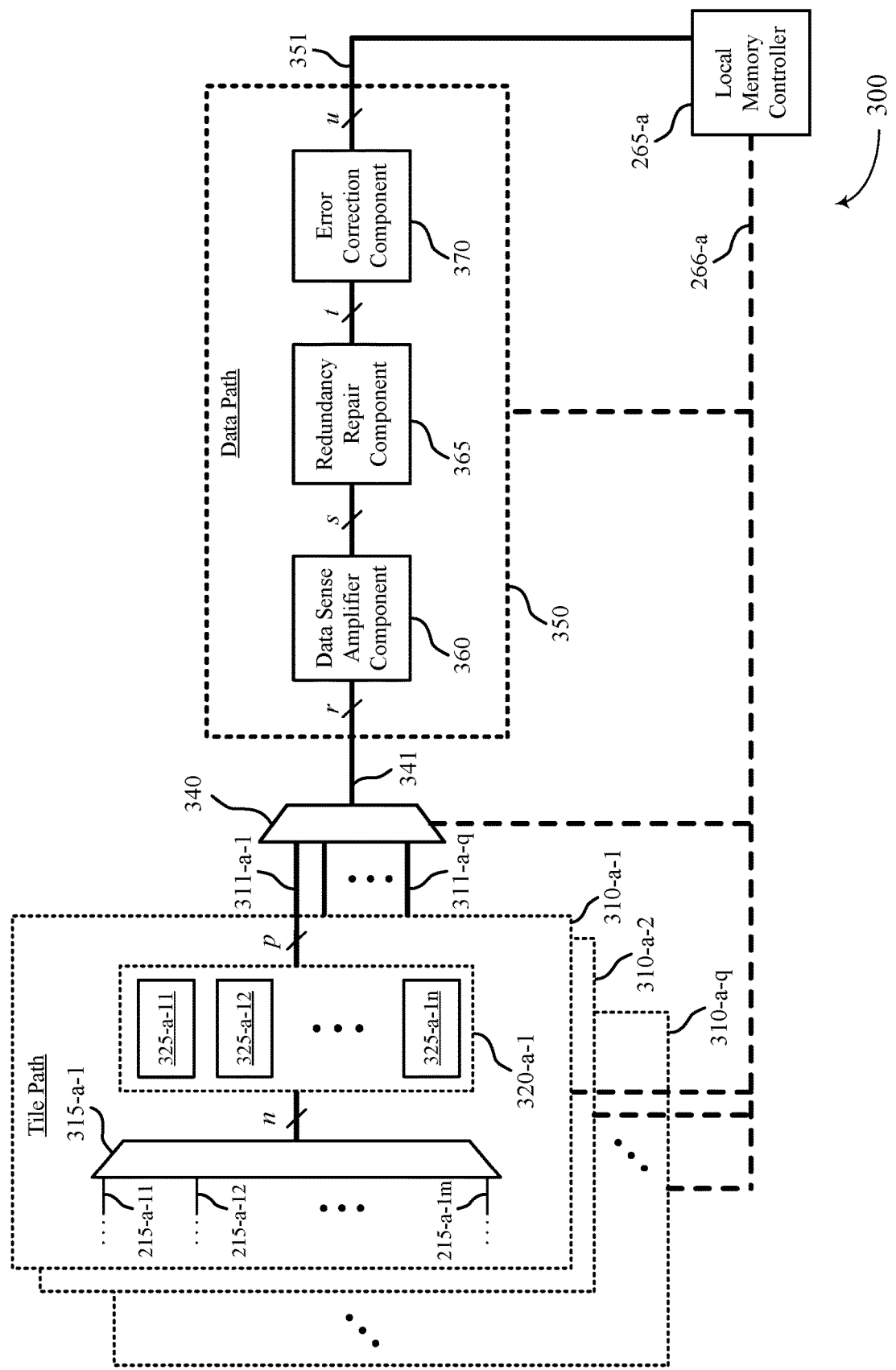
FIG. 3 illustrates an example of a memory layout that supports circuitry borrowing for memory arrays in accordance with examples as disclosed herein.

FIG. 3 illustrates an example of a memory layout 300 that supports circuitry borrowing for memory arrays within a memory device in accordance with examples as disclosed herein. The memory layout 300 may be included in or otherwise illustrate aspects of a memory die, such as a memory die 160 described with reference to FIG. 1 or a memory die 200 described with reference to FIG. 2. The memory layout 300 illustrates an example where a set of tile paths 310 (e.g., tile paths 310-a-1 through 310-a-q) may be selectively coupled with a data path 350 using a tile multiplexer 340.

The data path 350 may be communicatively coupled with a local memory controller 265-a over a data path bus 351 (e.g., a data bus) to support various access operations described herein (e.g., read operations, write operations, rewrite operations, refresh operations, exchanging data or information with a host of a memory device that includes the memory layout 300). In some examples, the data path 350, the tile multiplexer 340, or both may be considered to be included in an input/output component (e.g., an input/output component 260 described with reference to FIG. 2), or the data path 350 may be considered to be in communication between an array of memory cells 205 and an input/output component. In some examples, circuitry or operations related to information transfer with a memory array may be associated with the local memory controller 265-a, and the data path 350 may be an example of circuitry configured to process data or information communicated between the memory array and the local memory controller 265-a (e.g., where the local memory controller 265-a is part of, or otherwise performs functions related to an input/output of a memory device). In some examples, the local memory controller 265-a may be configured to control timing (e.g., timing of sense amplifier arrays 320-a, timing of sense amplifiers 325-a) or triggering of various operations or components of the tile paths 310, tile multiplexer 340, and the data path 350, which may include control signaling conveyed over a control bus 266-a, having one or more signal paths, that is shared or otherwise corresponds to all of the tile paths 310-a-1 through 310-a-q and the data path 350 (e.g., shared by a memory section or memory bank associated with the tile paths 310-a-1 through 310-a-q).

In the example of memory layout 300, interconnections between components are illustrated by buses (e.g., data buses, control buses) that may support multiple bits of information transfer. For example, the data path bus 351 may be associated with u bits of data transfer between the data path 350 and the local memory controller 265-a. In some examples, a quantity of bits of data transfer associated with a bus of the memory layout 300 may correspond to a number of discrete conductive signal paths (e.g., traces, wires, lines). For example, the data path bus 351 may be associated with u individual conductors or conductive traces between the data path 350 and the local memory controller 265-a. In other examples, components that communicate over a bus in the memory layout 300 may support a multi-level communication scheme, a multi-symbol communication scheme, a burst communication scheme, or some other signal modulation scheme that supports a particular quantity of bits of data transfer. For example, when the data path 350 and the local memory controller 265-s support a multi-symbol modulation scheme (e.g., a PAM3 scheme, a PAM4 scheme), the data path bus 351 may have fewer than u discrete signal paths to support the communication of u bits of data transfer. Although aspects of the buses of the memory layout 300 may be described with reference to a read operation or a write operation, buses of the memory layout 300 may be bidirectional buses that, in some examples, support both read operations and write operations. Accordingly, each end of a given bus of the memory layout 300 may be configured with a signal receiver, or a signal driver, or both a signal receiver and a signal driver.

The tile paths 310-a may be illustrative of circuit paths that support conveying, multiplexing, modifying, or otherwise processing signals between memory cells 205 (not shown) of a particular memory tile and the data path 350. In some examples, each of the tile paths 310-a may include or otherwise be associated with a unique or dedicated array of memory cells 205 that correspond to the respective tile path 310 or memory tile (e.g., a subarray of memory cells 205, memory cells 205 located in an array layer of the memory tile). Each of the tile paths 310-a may also be associated with a corresponding tile bus 311-a that is configured to convey one or more signals (e.g., carrying p bits of information) between the respective tile path 310-a and the tile multiplexer 340. In various examples, a tile bus 311 may be referred to as a local I/O bus or line of a memory tile or tile path 310-a or may refer to a set of more than one local I/O bus or line of a memory tile or tile path (e.g., where the respective tile bus 311-a is subdivided for various multiplexing or routing operations). Although certain details are illustrated with reference to the tile path 310-a-1, such details may be repeated in each of tile paths 310-a-2 through 310-a-q.

In the example of memory layout 300, each of the tile paths 310-a may include or otherwise correspond to a set of digit lines 215-a (e.g., digit lines 215-a-11 through 215-a-1m of tile path 310-a-1, a set of m digit lines 215-a), which may be examples of the digit lines 215 described with reference to FIG. 2. For example, each of the digit lines 215-a of the tile path 310-a-1 may be coupled with a respective switching component 245 of each of a set of memory cells 205 (e.g., a column of memory cells 205 of or corresponding to the tile path 310-a-1), where the respective switching component 245 may be configured to selectively couple a storage element of the memory cell 205 (e.g., a capacitor 240, a material memory element, another type of memory storage element) with the digit line 215-a. Accordingly, each of the memory cells 205 of or corresponding to the tile path 310-a-1 may be coupled with one of the digit lines 215-a-11 through 215-a-1m. In various examples, such a coupling between memory cells 205 and a digit line 215-a may be a direct coupling (e.g., directly along a conductive path or access line), or an indirect coupling (e.g., via circuit components or signal processing circuitry). For example, a digit line 215-a may include or otherwise be associated with signal development circuitry such as an amplifier, a cascode, a charge transfer sensing amplifier (CTSA), an amplification capacitor, and others.

For each of the tile paths 310-a, a row of memory cells 205 of the tile path 310-a may be selected or selectively activated by activating a word line 210 (not shown) that is included in the tile path 310-a, or otherwise corresponds to the tile path 310-a (e.g., is included in the memory tile corresponding to the tile path 310-a). For example, activating a word line 210 of or corresponding to the tile path 310-a-1 may couple a row or page of capacitors 240, material memory elements, or other type of memory storage elements, of respective memory cells 205 with a respective one of the digit lines 215-a-11 through 215-a-1m. In various examples, tile paths 310 may or may not include drivers, buffers, or multiplexers (e.g., a row decoder 225, or portion thereof, as described with reference to FIG. 2) to selectively activate word lines 210 or other selection lines.

For each of the tile paths 310-a, various ones of the set of m digit lines 215-a may be selectively coupled with or routed to a respective sense amplifier array 320-a of the tile path 310-a using a digit line multiplexer 315-a. For example, tile path 310-a-1 may include a sense amplifier array 320-a-1 having n sense amplifiers 325-a (e.g., sense amplifiers 325-a-11 through 325-a-1n). Thus, the digit line multiplexer 315-a-1 may be configured for selective coupling or mapping between m signal paths associated with digit lines 215-a-11 through 215-a-1m and n signal paths associated with the sense amplifier array 320-a-1 (e.g., n sense amplifiers 325-*a*). In some examples, the sense amplifier arrays 320-*a* may be considered to be included in, or otherwise refer to functions or circuitry of a sense component 250 described with reference to FIG. 2.

The sense amplifiers 325-*a* may include circuitry configured to latch a signal indicative of a logic state stored by a memory cell 205, such as sets of cross-coupled transistors that latch an output based on a comparison of a read signal from the memory cell 205 with a reference signal. In some examples, the sense amplifiers 325-*a* or some other portion of the sense amplifier array 320-*a* may include circuitry configured to generate or develop such read signals (e.g., based at least in part on a selective coupling with a memory cell 205) or generate or develop such reference signals. In some examples, the sense amplifiers 325-*a* may also be configured to generate or develop write signals to a digit line 215-*a* or a memory cell 205 (e.g., based at least in part on a write command of the local memory controller 265-*a*).

The digit line multiplexers 315-*a*, the sense amplifier arrays 320-*a*, and other circuitry corresponding to a given memory tile may be located in a circuit layer or level of a memory tile (e.g., a circuit level 450 of the memory tile 400, described with reference to FIG. 4), and the corresponding memory cells 205 of the memory tile may be located in an array layer or level of the memory tile (e.g., an array level 410 of the memory tile 400, described with reference to FIG. 4). In some cases, a circuit layer or level may be below (e.g., nearer to a substrate than) an array layer or level of the memory tile. In some cases, aspects of a line or bus as described herein (e.g., all or portions of a line or bus) may be located in a circuit layer or level of one or more memory tiles, a routing layer or level of one or more memory tiles (e.g., one or more metallization layers), a routing layer or level of a memory section or bank, or various combinations thereof. In various examples, an array layer or level may be between the circuit layer or level and one or more routing layers or levels. In some examples, one or more sockets (e.g., vias, conductive plugs) may provide interconnections between components at different layers or levels of a memory tile or memory bank. In some cases, sockets may be located between memory tiles within an array (e.g., in gaps between different memory tiles).

Control signal drivers that output control signals and control the timing signals of the sense amplifiers 325-*a* may also be located below an array level or layer of the memory tile (e.g., in a circuit level). In some cases, the control bus 266 or local memory controller 265 may provide inputs to one or more control signal drivers. In some cases, a set of drivers may be common to or otherwise correspond to a respective memory section of memory tiles and coupled to a set of shared circuitry by conductors (e.g., conductive lines, sockets). In some cases, the set of drivers may include drivers of a first type (e.g., configured to generate a first type or set of control signals) and drivers of a second type (e.g., configured to generate a second type or set of control signals). The drivers of the first type may be coupled with a first set of shared circuitry that is common to the respective memory section and a second memory section. The drivers of the second type may be coupled with a second set of shared circuitry that is common to the respective memory section and a third memory section. In some cases, the first set of shared circuitry includes a first set of sense amplifiers 325-*a*. A first subset of the first set of sense amplifiers 325-*a* underlies memory tiles of the respective memory section and a second subset of the first set of sense amplifiers 325-*a* underlies memory tiles of the second memory section. A second set of shared circuitry may include a second set of sense amplifiers 325-*a*. A first subset of the second set of sense amplifiers 325-*a* underlies memory tiles of the respective memory section and a second subset of the second set of sense amplifiers 325-*a* underlies memory tiles of the third memory section. Additionally or alternatively, the first set of shared circuitry may include data path circuitry shared by (borrowed between) memory tiles of the respective memory section and memory tiles of the second. memory section, and the second set of shared circuitry may include data path circuitry shared by (borrowed between) memory tiles of the respective memory section and memory tiles of the third memory section.

Each of the sense amplifiers 325-*a* may be configured to receive a signal from a respective memory cell 205 over a respective digit line 215-*a* according to a particular selection, mapping, or other configuration of the respective digit line multiplexer 315-*a*. For example, when the digit line multiplexer 315-*a*-1 is configured for coupling the sense amplifier array 320-*a*-1 with a subset of the digit lines 215-*a*-11 through 215-*a*-1*m* (e.g., a portion or subset of a row, a portion or subset of a page, when n<m), the digit line multiplexer 315-*a*-1 may receive a signal (e.g., from the local memory controller 265-*a*, over the control bus 266-*a*) to couple a particular subset of the digit lines 215-*a*-11 through 215-*a*-1*m* according to a particular access operation. In some examples, a memory layout may include a sense amplifier 325 for each of the digit lines 215 in a tile path 310 (e.g., where n=m), in which case a digit line multiplexer 315 may be omitted from the tile path 310.

The sense amplifier arrays 320-*a* (e.g., each of the sense amplifiers 325-*a*) may output signals indicative of the logic state stored by respective memory cells 205 (e.g., when performing functions of a read operation). In some examples, the output of a sense amplifier 325-*a* when reading a set of logic states that may be stored by the memory cells 205 may be associated with a relatively narrow or small voltage swing (e.g., a relatively small range of voltages for indicating the set of logic states, compared to a voltage swing used in a portion of or at an output of the data path 350). Using a relatively narrow voltage swing at the sense amplifiers 325-*a* may mitigate the risk of signal disturbance (e.g., due to capacitive or other cross-coupling or crosstalk) of concurrently transmitted signals or of data states stored in memory cells 205, and may also support corresponding components or circuitry occupying a relatively small area, or relatively thin dielectric separation between components or conductors of a tile path 310-*a* (e.g., between sense amplifiers 325-*a*, between conductive lines of a bus to or from a tile path 310-*a*, between memory cells 205), or relatively low charge accumulation or signal attenuation (e.g., related to capacitive loading such as intrinsic capacitance of access lines between a memory cell 205 and the data path 350), or relatively low charge leakage or power consumption in a tile path 310-*a* (e.g., related to charge leakage between components of the memory layout 300, related to charge leakage across portions meant to be electrically isolated by a dielectric portion, related to powering voltage sources or drivers for operating the memory layout 300).

In some examples, a sense amplifier array 320 may additionally include a sense amplifier selection component or multiplexer (not shown) which may be configured to select, enable, activate, latch, or route signals from a subset (e.g., fewer than all) of the sense amplifiers 325 of the sense amplifier array 320 (e.g., based on a column address associated with an access command). For example, such a selection component or multiplexer may select or activate half of the sense amplifiers 325 of the sense amplifier array 320, a quarter of the sense amplifiers 325 of the sense amplifier array 320, and so on (e.g., in response to signaling received from the control bus 266-a). When supporting read operations, for example, the output of such a sense amplifier array 320 may accordingly be configured to output fewer bits of data transfer than a number of sense amplifiers 325 in the sense amplifier array 320.

In some examples, a sense amplifier array 320 of one tile path 310, or a portion thereof, may be configured for a selective coupling with another tile path 310. In a partially-powered or partially-operational mode of a memory device, for example, the memory layout 300 may support a selective activation, deactivation, or idling of certain memory tiles or tile paths 310. In such examples, a sense amplifier array 320 or portion thereof (e.g., a subset of sense amplifiers 325) of a deactivated or idled memory tile may be shared, shunted, or otherwise coupled with an activated memory tile (e.g., an array of memory cells 205 of an activated memory tile, a sense amplifier array 320 of an activated memory tile). Thus, in some examples, a sense amplifier array 320 or a set of sense amplifiers 325 may be primarily dedicated to a certain memory tile or tile path 310, but, in some cases (e.g., certain operational modes), a sense amplifier array 320 or a set of sense amplifier 325 may be shared with another memory tile or tile path 310 (e.g., an adjacent memory tile or tile path 310). In other examples, a sense amplifier array 320 may be included in, or otherwise considered to be a part of a data path 350.

In some examples, a sense amplifier array 320, or another portion of a tile path 310, may include buffering functions or circuitry (e.g., a row buffer, a page buffer, a prefetch buffer). To support aspects of a read operation, for example, such a buffer may be configured to maintain or store signals corresponding to detected logic states that are not passed to the tile multiplexer 340 in a given operation (e.g., a subset of a row, a subset of a page). In various examples, such a buffering function may be configured to pass the stored signals to the tile multiplexer 340 at a later time or use such stored signals to support a write-back or rewrite command (e.g., rewriting a detected logic state to a memory cell 205).

Accordingly, in some examples, the side of a sense amplifier array 320 that is electrically coupled towards a data path 350 (e.g., coupled with a respective tile bus 311-a) may be configured to support a smaller number of bits of data transfer than the side of the sense amplifier array 320 that is electrically coupled towards digit lines 215 or memory cells 205 of a corresponding memory array (e.g., where p<n). In other examples, such a selection component or multiplexer may be omitted, and the side of a sense amplifier array 320 that is electrically coupled towards a data path 350 may be configured to support a same number of bits of data transfer as the side of the sense amplifier array 320 that is electrically coupled towards digit lines 215 or memory cells 205 of a corresponding memory array (e.g., where p=n).

The set of tile paths 310-a (e.g., the sense amplifier arrays 320-a), or various portions thereof, may be selectively coupled with the data path 350 using a tile multiplexer 340. In the example of memory layout 300, the tile multiplexer 340 is coupled with the respective tile bus 311-a for each of the tile paths 310-a (e.g., tile buses 311-a-1 through 311-a-q, a set of local I/O buses or lines), where each of the tile buses 311-a may be configured to carry p bits of information. Accordingly, where each of the p bits of information are carried on distinct signal paths, the tile multiplexer 340 may be configured for selective coupling or mapping of (p×q) signal paths on the array side of the tile multiplexer 340. On the data path side, the tile multiplexer 340 may be configured to carry r bits of information (e.g., corresponding to r digit lines 215-a, corresponding to r memory cells 205), and where each of the r bits of information are carried on distinct signal paths, the tile multiplexer 340 may be configured for selective coupling or mapping of r signal paths. In other words, the tile multiplexer 340 may be configured for selective coupling or mapping between (p×q) signal paths associated with tile buses 311-a and r signal paths associated with the data path 350 (e.g., a tile multiplexer bus 341). In some examples, the circuit path between the tile paths 310-a and the data path 350 (e.g., the circuit between sense amplifier arrays 320-a and a data sense amplifier component 360, including the tile buses 311-a, the tile multiplexer 340, and the tile multiplexer bus 341) may be referred to as a column path circuit.

In various examples, the tile multiplexer 340 may receive a signal (e.g., from a local memory controller 265) to couple the data path 350 with a particular tile path 310-a, or with portions of more than one tile path 310-a, according to a particular access operation. In one example, the tile multiplexer 340 may be configured to access memory tiles one-at-a-time, such that the data path 350 is coupled with r signal paths from a single memory tile (e.g., from r digit lines 215-a of a single tile bus 311-a). In another example, the tile multiplexer 340 may be configured to multiple access memory tiles at a time, such that the data path 350 is coupled a subset of r signals from a one memory tile (e.g., a first tile bus 311-a) and another subset of r signals from another memory tile (e.g., a second tile bus 311-a). For example, the tile multiplexer bus 341 may refer to a collection of main I/O lines, where one or more of the main I/O lines may be shared across a set of memory tiles or tile paths 310-a (e.g., a column of memory tiles, a row of memory tiles), and main I/O lines may be selectively coupled (e.g., by a portion of the tile multiplexer 340) with a local I/O line corresponding to one or more of the set of memory tiles or tile paths 310-a. In some examples, the tile multiplexer 340 may support accessing memory tiles one-at-a-time and many-at-a-time, and a selection between the two may be made at a local memory controller 265 for supporting a particular access operation, a particular mode of operation, or a particular configuration in a given application or installation.

Although the tile multiplexer 340 is illustrated as a single component, in some examples, various functions or subcomponents of the tile multiplexer 340 may be distributed in different portions of the memory layout 300 (e.g., as a distributed transistor network or selector network). For example, selective coupling, mapping, or routing at a first granularity or regularity may be accomplished by a first set of subcomponents, which may be part of the data path 350, and selective coupling, mapping, or routing at a second granularity or regularity may be accomplished by a second set of subcomponents, which may be distributed across the tile paths 310-a-1 through 310-a-q. Accordingly, the tile paths 310-a may include various circuitry that is dedicated to, or otherwise corresponds to operating respective memory tiles of a set of memory tiles, the data path 350 may include various circuitry that is dedicated to, or otherwise corresponds to operating all of the set of memory tiles, and various portions of the tile multiplexer 340 may or may not be considered to be part of the tile paths 310-a-1 through 310-a-q or the data path 350.

The data path 350 may illustrate an example of circuitry, corresponding to a plurality of memory tiles (e.g., all of the tile paths 310-*a*-1 through 310-*a*-*q*), that is configured to transfer information or provide various management of information associated with access operations for the plurality of memory tiles. In accordance with the described techniques for circuit partitioning, the components of the data path 350 may be located in the circuit layer or level of two or more memory tiles of the plurality of memory tiles. In the example of memory layout 300, the data path 350 includes a data sense amplifier component 360, a redundancy repair component 365, and an error correction component 370. In other examples of a memory layout, a data path 350 may include more or fewer components, or components that are divided into various other subcomponents or subfunctions. Moreover, although the data path 350 illustrates a single path between a tile multiplexer bus 341 and a data path bus 351, other examples of a data path 350 may have more than one path between a tile multiplexer bus 341 and a data path bus 351 (e.g., a read path and a write path). Thus, in some examples, the data path 350 may include circuitry configured to multiplex read or write pipelines of the memory layout 300.

The data sense amplifier component 360 may be referred to as a "front end" of the data path 350 and may include circuitry configured to amplify signals received at the data path 350 over the tile multiplexer bus 341. For example, to support various read operations, signals conveyed from one or more tile paths 310-*a* through the tile multiplexer 340 may have a first voltage swing (e.g., a partial swing or low swing, corresponding to reading the memory cells 205, corresponding to latch voltages of sense amplifiers 325-*a*, corresponding to a set of logic states that may be stored by the memory cells 205). To support various operations or processing of the data path 350, the data sense amplifier component 360 may amplify such signals to generate signals having a second voltage swing (e.g., a full swing or a high swing) that is greater than the first voltage swing. Using a relatively wider or greater voltage swing in the data path 350 may support more robust signal transfer through the data path 350, or to a local memory controller 265, which may be related to relatively lower sensitivity to interference, relatively lower sensitivity to voltage drop or signal decay along resistive signal paths, relatively lower sensitivity to various charge leakage paths in the data path 350, and other characteristics associated with a relatively greater voltage swing.

In some examples, the data sense amplifier component 360 may include a single amplifier for each signal path of the tile multiplexer bus 341 (e.g., a 1:1 correspondence between an amplifier and a memory cell 205 or bit of transferred information, a set of r amplifiers). Thus, the data sense amplifier component 360 may include one or more circuit elements for each memory cell 205, or each bit of information accessed in a memory array, involved in a given access operation. Such a granularity or regularity may be referred to as a "bit slice" of the data path 350, where each bit slice of the data path includes one or more circuit elements that are repeated for each bit or memory cell 205 involved in an access operation supported by the data path 350.

In some examples, the data sense amplifier component 360 may be used to support read operations but not write operations, and accordingly the data sense amplifier component 360 may be bypassed in some access operations (e.g., alternatively coupling the tile multiplexer bus 341 with a write driver of the data path 350, not shown). In some examples, a data sense amplifier component 360 may be omitted from a data path 350, such as when a sense amplifier array 320 or sense amplifiers 325 are configured to output a full swing or high swing output (e.g., to a data path 350), where full swing may refer to a same voltage swing as used in a portion of or at an output of the data path 350.

The redundancy repair component 365 may be configured to replace or reroute data that is read from or would otherwise be written to a digit line 215 or a memory cell 205 that is known to be faulty, or is suspected to be faulty (e.g., as identified from array detection operations, error correction operations, manufacturing validation operations). In a read operation, for example, the redundancy repair component 365 may be configured to ignore a bit received from the data sense amplifier component 360 or ignore a signal path from the data sense amplifier component 360 and reroute or otherwise reconfigure signals to account for the faulty digit line 215 or memory cell 205. In a write operation, for example, the redundancy repair component 365 may be configured to reroute or otherwise reconfigure write signals or data to avoid writing a bit to a faulty digit line 215 or memory cell 205. Accordingly, a bus on the array side of the redundancy repair component 365 may be configured to carry more bits than a bus on the opposite side of the redundancy repair component 365 (e.g., where s>t). In one example, the memory layout 300 may be configured for one redundancy bit per byte of information transfer on the data path bus 351 (e.g., one redundancy bit per eight bits of information), though such a ratio is configurable to other ratios based on various design tradeoffs.

The error correction component 370 may be configured to detect or correct various data corruption or errors, and, in some cases, may recover data (e.g., during a read operation) before transmitting over the data path bus 351. Such error detection and correction may rely upon one or more error-correcting codes such as block codes, convolutional codes, Hamming codes, low-density parity-check codes, turbo codes, polar codes, and others. These processes, operations, and techniques may be referred as ECC processes, ECC operations, ECC techniques, or, in some cases, as simply ECC. In some examples, the error correction component 370 may include or be referred to as an in-line ECC. In a read operation, for example, the error correction component 370 may perform an error correction operation on data read from a memory array (e.g., as read or otherwise conveyed from one or more tile paths 310-*a*) according to the read operation. The error correction component 370 may generate corrected data (e.g., in a correction subcomponent) or an indication of a detected error (e.g., in a detection subcomponent). The error correction component 370 may output data, which, in various circumstances, may be the data read from the memory array, or data that has been corrected.

In one example of performing ECC operations, the error correction component 370 may calculate the "syndrome" of incoming read data (e.g., as received from the redundancy repair component 365), and the syndrome may be compared to one or more corresponding parity bits that accompany the incoming read data (e.g., as read from a memory cell 205 of a same or different tile path 310-*a*). When the calculated syndrome does not equal the corresponding parity bit or bits, the error correction component 370 may attempt to correct the incoming read data before forwarding it (e.g., over the data path bus 351), or send a signal that an error has been detected (e.g., over the control bus 266-*a*), or both. In another example of performing ECC operations, the error correction component 370 may calculate the parity bit of incoming write data (e.g., as received from the local memory controller 265-*a* over the data path bus 351, for later comparison to a calculated syndrome when reading the data), and the calculated parity bit may be written to a memory cell 205 of a same or different tile path 310-*a* as where the incoming write data is written. In one example, the memory layout 300 may be configured for one parity or ECC bit per byte of information transfer on the data path bus 351 (e.g., one parity bit per eight bits of information), though such a ratio is configurable to other ratios based on various design tradeoffs.

In some examples, the error correction component 370 may include logic or circuitry to detect a memory cell 205 or a digit line 215 associated with charge leakage, store an indication of such a detection, and where appropriate, invert a logic state that is to be written to the memory cell 205 or digit line 215, or invert a logic state that is read from the memory cell 205 or digit line 215, to mitigate the effect of charge leakage.

The data path 350 (e.g., the data path bus 351) and the tile paths 310-a may be configured according to various multiples, multiplexing configurations, and selective operations. For example, the quantity of bits associated with access operations of the data path 350 (e.g., u bits of the data path bus 351) may correspond to a quantity of bits of an access command, such as a column access command, a column access strobe (CAS) command, or a prefetch command. Other buses of the memory layout 300 may be associated with a greater number of bits, according to various configurations of the memory layout 300.

In one illustrative example, the data path 350 may be associated with 256 bits of information transfer (e.g., a data packet or data burst of 256 bits), which, in some examples, may correspond to the data path bus 351 being configured with 256 separate conductive traces (e.g., where u=256). The error correction component 370 may be configured with one parity bit per eight bits of data transfer (e.g., on the data path bus 351), and accordingly the error correction component 370 may be coupled with the redundancy repair component 365 using a bus having 288 separate conductive traces (e.g., where t=288). The redundancy repair component 365 may be configured with one redundancy bit per eight bits of data transfer (e.g., on the data path bus 351), and accordingly the redundancy repair component 365 may be coupled with the data sense amplifier component 360 using a bus having 320 separate conductive traces (e.g., where s=320).

In examples of a data path 350 that includes a data sense amplifier component 360, the data sense amplifier component 360 may be configured with an amplifier for each of the conductive traces (e.g., on either side of the data sense amplifier component 360), and accordingly may be coupled with the tile multiplexer 340 and the redundancy repair component 365 using buses having a same number of conductive traces (e.g., where r=s=320). Thus, according to the illustrative example, the data path 350 may be configured to be communicatively coupled between a 320-bit or 320-conductor tile multiplexer bus 341 and a 256-bit or 256-trace data path bus 351. In other words, the data path 350 may be associated with a 25% overhead (e.g., a 125% ratio of memory cells 205 accessed in a given access operation to data bits conveyed with the local memory controller 265-a) to support redundancy and error correction operations for the set of memory tiles corresponding to the tile paths 310-a-1 through 310-a-q.

Continuing with the illustrative example, the tile paths 310-a and the tile multiplexer 340 may be configured with various multiples and multiplexing to support a 320-bit or 320-conductor tile multiplexer bus 341. For example, the memory layout 300 may include or correspond to a set or section of 64 memory tiles (e.g., where q=64). To support a given access operation, the tile multiplexer 340 may be configured to selectively couple half of the 64 corresponding tile paths 310-a (e.g., every other tile path 310-a according to an arrangement of tile paths 310-a in the set or section) with the tile multiplexer bus 341. Accordingly, the tile multiplexer bus 341 may be coupled with 32 tile paths 310-a using a respective 10-bit or 10-conductor tile bus 311-a (e.g., where p=10). In some examples, such a configuration may be supported by tile paths 310-a or tile buses 311-a that each include or are otherwise associated with two local I/O buses or lines, each configured to convey five bits (e.g., each having five individual conductors or traces, each coupled with a different subset of five sense amplifiers 325-a of a sense amplifier array 320).

Further continuing with the illustrative example, the sense amplifier arrays 320-a may be configured with various multiples and multiplexing to support 10-bit or 10-conductor tile buses 311-a. In one example, this configuration may correspond to a coupling with a sense amplifier array 320-a where each of the conductors of the respective tile bus 311-a is coupled with a single, dedicated sense amplifier 325-a (e.g., where n=p=10). In another example, this configuration may correspond to a sense amplifier array 320-a where conductors of the respective tile bus 311-a are selectively coupled with a subset of the sense amplifiers 325-a of the sense amplifier array 320-a (e.g., where n>p). For example, the sense amplifier arrays 320-a may each include 80 sense amplifiers 325 (e.g., where n=80), and the sense amplifier array 320-a may include a selection component or multiplexer that is configured to select or couple one of eight subsets of ten sense amplifiers 325-a with the respective tile bus 311-a.

Further continuing with the illustrative example, the memory cells 205 corresponding to a given tile path 310-a may be configured with various multiples and multiplexing to support the described coupling with a sense amplifier array 320-a. In one example, each of the tile paths 310-a may include or otherwise be associated with 2,560 digit lines 215-a (e.g., where m=2,560). According to different configurations of the memory layout 300, the digit line multiplexers 315-a may be configured to select or couple one of 256 subsets of ten digit lines 215-a with the respective sense amplifier array 320-a (e.g., to support a 10-bit or 10-conductor tile bus 311-a with a sense amplifier array 320-a having ten sense amplifiers 325-a), or the digit line multiplexers 315-a may be configured to select or couple one of 32 subsets of 80 digit lines 215-a with the respective sense amplifier array 320-a (e.g., to support a 10-bit or 10-conductor tile bus 311-a with a sense amplifier array 320-a having 80 sense amplifiers 325-a, arranged as eight selectable subsets of the sense amplifiers 325-a).

In one example of the memory layout 300, each of the tile paths 310-a may also include or otherwise be associated with 2,048 word lines 210. Thus, according to the illustrative example, the memory layout 300 may include memory tiles each having 5,242,880 memory cells 205. When the memory layout 300 refers to a section or bank of a memory device having 64 memory tiles, the memory layout 300 may therefore illustrate an arrangement that supports the selective accessing of an array of 335,544,320 memory cells 205 using a data path bus 351 associated with 256 bits of data transfer (e.g., 256 conductive traces).

In some examples, word lines 210 may be commonly accessed across multiple memory tiles (e.g., all or a subset of memory tiles within a bank or section), or signals for activating word lines 210 of different memory tiles may be shared or commonly driven. For example, in response to a particular prefetch or other access command, a page or row activation may correspond to an activation of 20,480 memory cells 205 or digit lines 215 (e.g., corresponding to 16,384 bits of data plus additional redundancy or parity bits), which may be distributed across 64 memory tiles, 32 memory tiles, 16 memory tiles, or some other number of memory tiles based on a particular multiplexing scheme of the memory layout 300 (e.g., according to different configurations of digit line multiplexers 315-a or tile multiplexer 340). In other examples (e.g., according to various partial activation, partial deactivation, or other idling techniques), a particular prefetch or other access command may be associated with half that quantity of memory cells 205 or digit lines 215, one quarter that quantity of memory cells 205 or digit lines 215, or some other amount. Signals from such a page or row activation may be selectively routed to various sense amplifier arrays 320-a of various tile paths 310-a in accordance with various examples of the described techniques.

In some examples, the data path 350 may be considered to end or terminate at die data pads of a memory die, such as a memory die 160 or a memory die 200. Although the memory layout 300 illustrates an example where a single data path 350 is coupled with the local memory controller 265-a, in other examples, a local memory controller 265, a local memory controller 165, or a device memory controller 155 may be selectively coupled with a set of more than one data path 350. In such examples, a memory die may include a data path multiplexer (not shown) configured to selectively couple the local memory controller 265, the local memory controller 165, or the device memory controller 155 with one or more of the corresponding data path buses to support various access operations.

Figure 4:
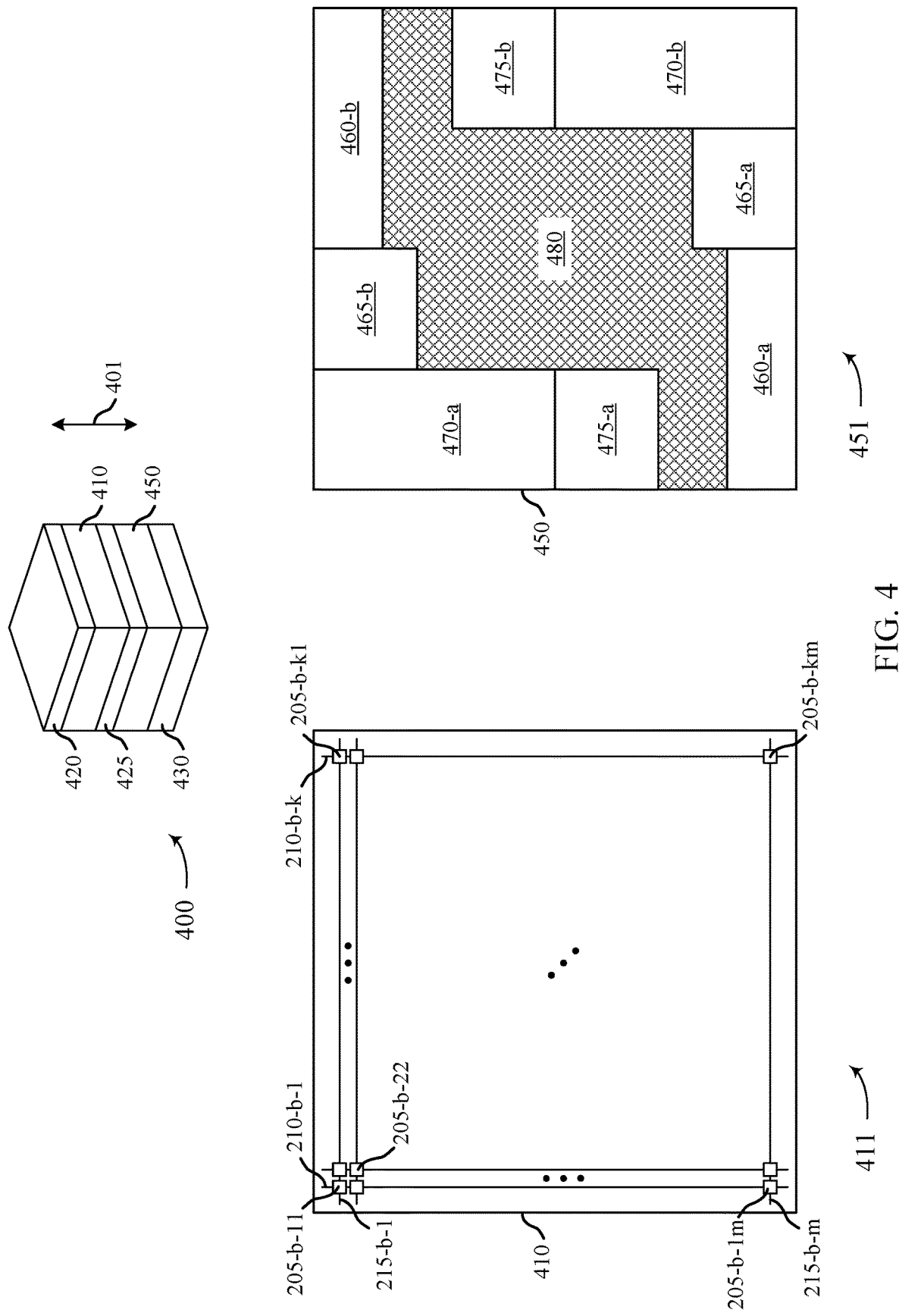
FIG. 4 illustrates an example of a memory tile that supports circuitry borrowing in accordance with examples as disclosed herein.

FIG. 4 illustrates an example layout of a memory tile 400 that supports circuitry borrowing for memory arrays within a memory device in accordance with examples as disclosed herein. The memory tile 400 illustrates a layout having levels (e.g., layers) relative to a thickness direction 401, which may refer to a direction perpendicular to a substrate, or a direction otherwise perpendicular to a plane of memory cells 205. The memory tile 400 includes an example of an array level 410 and a circuit level 450, which are shown relative to a substrate level 430. Although the memory tile 400 is illustrated with an array level 410 being above a circuit level 450 (e.g., relative to the substrate 430), in other examples or memory tiles 400, an array level 410 may be below a circuit level 450. Further, although one array level 410 and one circuit level 450 is shown in the example of memory tile 400, other examples of a memory tile 400 may include more than one array level 410, or more than one circuit level 450, or more than one array level 410 and more than one circuit level 450.

The array level 410 includes a plurality of memory cells 205-b, associated with word lines 210-b and digit lines 215-b that are configured to access the memory cells 205-b of the array level 410 (e.g., of the memory tile 400). For example, the array level 410 may include or be associated with k word lines 210-b (e.g., word lines 210-b-1 through 210-b-k) and m digit lines 215-b (e.g., digit lines 215-b-1 through 215-b-m), that are associated with the memory cells 205-b-11 through 205-b-km (e.g., a quantity of (k×m) memory cells 205). In an illustrative example, the array level 410 may be associated with 2,048 word lines 210-b (e.g., where k=2,048) and 2,560 digit lines 215-b (e.g., where m=2,560), and accordingly may be associated with 5,242,880 memory cells 205-b. However, the described techniques may support memory tiles 400 having other quantities of memory cells 205, word lines 210, and digit lines 215.

The array level 410 is illustrated with a top view 411, showing word lines 210-b and digit lines 215-b intersecting at respective memory cells 205-b. However, the memory cells 205-b, word lines 210-b, and digit lines 215-b may be formed or located at different positions or sub-levels (e.g., in the thickness direction 401) of the memory tile 400. In one example, the word lines 210-b may be below the memory cells 205-b (e.g., nearer to the substrate 430), and the digit lines 215-b may be below the word lines 210-b. Further, the array level may also include a plurality of plate lines 220 (not shown), or a common plate conductor, which may be formed or located at another position or sub-level of the memory tile 400 or array level 410. For example, the memory tile 400 or array level 410 may include a common plate conductor that is above the memory cells 205-b (e.g., farther from the substrate 430), and is shared by all the memory cells 205-b of the array level 410 (e.g., of the memory tile 400), which may refer to a common electrical node to all of the memory cells 205-b (e.g., a common electrical node of the memory tile 400). In one example, an array of memory cells 205 that all share such a common electrical node or common plate may define the extents (e.g., in number of word lines 210, in number of digit lines 215, in dimensions perpendicular to the thickness direction 401) of the memory tile 400. However, in some examples, the memory tile 400 may be subdivided into sub-units that have separately controllable plate nodes, or multiple memory tiles 400 may share a single controllable plate node, or such common electrical nodes or common plates of multiple memory tiles 400 that are separately controllable may be otherwise controlled to a same biasing (e.g., commonly controlled).

The array level 410 may be defined in the thickness direction 401 according to various constituent components. In the described example having a common plate conductor above the memory cells 205-b and the digit lines 215-b below the word lines 210-b, the array level 410 may be defined by an illustrative range in the thickness direction 401 that includes the common plate conductor and the digit lines 215-b, and portions of the array level 410 therebetween (e.g., the word lines 210-b and the memory cells 205-b). In another example, the array level 410 may be defined by an illustrative range in the thickness direction 401 by the memory cells 205-b (e.g., including the various features that are specific to a respective memory cell 205-b, including a storage element such as a capacitor 240 or configurable material memory element, a switching component 245, where present, and other memory cell features), in which case access lines or nodes such as the word lines 210-b, the digit lines 215-b, and plate lines 220 or a common plate conductor are considered to be outside (e.g., above or below) the array level 410. In some examples, the range in the thickness direction 401 that includes the features of the memory cells 205-b may be considered to be a minimum range in the thickness direction 401 that defines an array level 410.

The circuit level 450 may include various circuitry configured to operate the memory cells 205-b of the array level 410 (e.g., tile-specific circuitry, circuitry primarily corresponding to the memory tile 400, circuitry corresponding to or primarily assigned to the memory cells 205-b-11 through 205-b-km). For example, the circuit level 450 may include various decoders, buffers, multiplexers, sense amplifiers, or other components that may be dedicated to the operation of memory cells 205-b-11 through 205-b-km, and, in various examples, such circuitry may not be used in the operation of other memory cells 205 (e.g., of another memory tile 400, not shown) in the same or an adjacent section, or may be used in the operation of memory cells 205 of an adjacent memory tile 400 according to particular modes of operation. The circuit level 450 is illustrated with a top view 451, illustrating an example of a memory tile 400 that includes word line decoder portions 460, word line driver portions 465, digit line decoder portions 470, and digit line driver portions 475, but memory tiles 400 may include a circuit level 450 having a different arrangement components, or more or fewer components, that are primarily assigned to the operation of the memory tile 400.

The word line decoder portions 460 and the word line driver portions 465 may correspond to the word lines 210-*b*-1 through 210-*b*-*k* of the memory tile 400, and may be included in or otherwise refer to operations of a row decoder 225 described with reference to FIG. 2. The memory tile 400 illustrates an example where the circuit level 450 includes word line decoder portions 460 and word line driver portions 465 corresponding to different subsets of the word lines 210-*b*-1 through 210-*b*-*k*. For example, the word line decoder portion 460-*a* and the word line driver portion 465-*a* may correspond to word lines 210-*b*-1 through 210-*b*-(k/2), and the word line decoder portion 460-*b* and the word line driver portion 465-*b* may correspond to word lines 210-*b*-(k/2+1) through 210-*b*-*k*. As illustrated, in some examples, the word line decoder portion 460-*a* and the word line driver portion 465-*a* may be on an opposite end of the memory tile 400 (e.g., along a direction of word lines 210-*b*) from the word line decoder portion 460-*b* and the word line driver portion 465-*b*.

The word line decoder portions 460 and the word line driver portions 465 may perform various operations associated with selective accessing or activation of the word lines 210-*b*. For example, the word line driver portions 465 may be configured to receive control signals (e.g., via a control bus 266) associated with access commands (e.g., read commands, write commands) corresponding to the memory cells 205-*b* of the array level 410. In some examples, such access commands may be associated with a command to open a page of memory cells that includes a row of memory cells 205-*b* in the array level 410. The word line driver portions 465 may also include components or circuitry for buffering associated with access commands (e.g., a control buffer). In some examples, the word line driver portions 465 may include a voltage source for selectively activating word lines 210-*b*, or may be in electronic communication with such a voltage source that is shared between multiple memory tiles 400. The word line decoder portions 460 may include various multiplexing components (e.g., a transistor network) configured to couple a selection voltage source with a selected one or more of the word lines 210-*b*.

The digit line decoder portions 470 and the digit line driver portions 475 may correspond to the digit lines 215-*b*-1 through 215-*b*-*m* of the memory tile 400, and may be included in or otherwise refer to operations of a column decoder 230, a sense component 250, or an input/output component 260, or a combination thereof, described with reference to FIG. 2. In some examples, the digit line decoder portions 470 and the digit line driver portions 475 of the memory tile 400 may collectively refer to or be associated with at least a portion of a tile path 310. The memory tile 400 illustrates an example where the circuit level 450 includes digit line decoder portions 470 and digit line driver portions 475 corresponding to different subsets of the digit lines 215-*b*-1 through 215-*b*-*m*. For example, the digit line decoder portion 470-*a* and the digit line driver portion 475-*a* may correspond to digit lines 215-*b*-1 through 215-*b*-(m/2), and the digit line decoder portion 470-*b* and the digit line driver portion 475-*b* may correspond to digit lines 215-*b*-(m/2+1) through 215-*b*-*m*. As illustrated, in some examples, the digit line decoder portion 470-*a* and the digit line driver portion 475-*a* may be on an opposite end of the memory tile 400 (e.g., along a direction of digit lines 215-*b*) from the digit line decoder portion 470-*b* and the digit line driver portion 475-*b*.

The digit line decoder portions 470 and the digit line driver portions 475 may perform various operations associated with selective accessing or activation of the digit lines 215-*b*. For example, the digit line driver portions 475 may be configured to receive control signals (e.g., via a control bus 266) associated with access commands (e.g., read commands, write commands) corresponding to the memory cells 205-*b* of the array level 410. Additionally or alternatively, the digit line driver portions 475 may be configured to communicate data signals (e.g., with a tile multiplexer 340, with a data path 350, via a tile bus 311, via an input/output component 260) associated with access commands corresponding to the memory cells 205-*b* of the memory tile 400, and accordingly may include a transmitter, receiver, or transceiver associated with a tile bus 311. In other words, the memory tile 400 may be associated with a tile bus 311 that is connected with the digit line driver portions 475-*a* and 475-*b* (e.g., each coupled with a respective portion of the tile bus 311). In another example for defining extents of a memory tile 400 (e.g., in number of word lines 210, in number of digit lines 215, in dimensions perpendicular to the thickness direction 401), an array of memory cells 205 that all share a common tile bus 311 may define such extents. The digit line driver portions 475 may also include components or circuitry for buffering associated with access commands (e.g., a control buffer, a data buffer).

In some examples, access commands may be associated with a command to access or activate a subset of the digit lines 215-*b* of the memory tile 400, and each of the digit line decoder portions 470 may include a respective digit line multiplexer 315, or portion thereof, that receives control signaling via a control bus 266 to perform selective activations or connections. In another example, each of the digit line driver portions 475 may include a respective sense amplifier array 320, or portion thereof, including a plurality of sense amplifiers 325 (e.g., a respective subset or subarray of sense amplifiers 325) that may be selectively coupled with ones of the digit lines 215-*b* (e.g., by a digit line multiplexer 315 of the respective digit line driver portion 475) for detecting a logic state of a particular memory cell 205-*b*.

In some examples, the digit line driver portions 475 may include voltage sources for selectively activating or charging digit lines 215-*b*, or be in electronic communication with such a voltage source that is shared between multiple memory tiles. In some examples, the digit line driver portions 475 may include signal development components (e.g., of a sense amplifier array 320, or between a sense amplifier array 320 and memory cells 205-*b*) that develop, convert, or amplify signals to support the detection of logic states from the memory cells 205-*b*, or the writing of logic states to the memory cells 205-*b*.

In various examples, the circuit level 450 may be defined in the thickness direction 401 according to different constituent components. In one example, the circuit level 450 may be defined in the thickness direction 401 by the farthest extents in the thickness direction 401 of the circuitry corresponding to the operation of the memory tile 400 (e.g., the farthest extents of the union, in the thickness direction 401, of tile-specific circuitry of the memory tile 400, the farthest extents of the word line decoder portions 460, word line driver portions 465, digit line decoder portions 470, and digit line driver portions 475, collectively). In another example, the circuit level 450 may be defined in the thickness direction 401 by the extents in the thickness direction 401 having a portion of each type of circuitry corresponding to the operation of the memory tile 400 (e.g., the farthest extents of the intersection, in the thickness direction 401, of tile-specific circuitry of the memory tile 400, the farthest extents of the word line decoder portions 460, word line driver portions 465, digit line decoder portions 470, and digit line driver portions 475, collectively).

The memory tile 400 may also include, or be otherwise associated with routing levels, which may be considered to routing levels of the memory tile 400, routing levels of a bank or section of multiple (e.g., adjacent) memory tiles 400, routing levels of a plurality of banks or sections of memory tiles 400, or, more generally, routing levels of a memory die 160 or a memory die 200. For example, the memory tile 400 may include a routing level 420, which may be referred to as an "over-array" routing level, and a routing level 425, which may be referred to as an "under-array" routing level.

The routing levels 420 and 425 may include one or more levels or layers (e.g., stacked in the thickness direction 401) of conductive paths for routing signals or power (e.g., supplied voltage, supplied current) in a memory die. In one example, the routing level 420 may include four layers of conductive paths, where two of the layers each include a plurality of conductive paths that are perpendicular to word lines 210 (e.g., of the array level 410) and two of the layers each include a plurality of signal paths that are perpendicular to digit lines 215. In another example, the routing level 425 may include three layers of conductive paths, where two of the layers each include a plurality of conductive paths that are perpendicular to word lines 210 and one of the layers includes a plurality of conductive paths that are perpendicular to digit lines 215. However, various arrangements of conductive paths may be used in a routing level 420 or 425, including layers having conductive paths in multiple directions or conductive paths that are nonlinear. In some examples, one or more of the conductive paths of the routing level 420 (e.g., sublayers of the routing level 420) may be formed of copper, and one or more of the conductive paths of the routing level 425 (e.g., sublayers of the routing level 425) may be formed of tungsten, where such formation may include selective deposition or removal (e.g., etching) to form the particular signal paths.

In some examples, the array level 410 or the circuit level 450 may be defined in the thickness direction 401 according to the relative positions of routing layers. In one example, the array level 410 may correspond to the portion of the memory tile 400 that is between a routing level 420 and a routing level 425 (e.g., along the thickness direction 401). In another example, the circuit level 450 may correspond to the portion of the memory tile 400 that is between a routing level 425 and a substrate 430 or another routing level (not shown).

The memory tile 400 may also include conductors along the thickness direction 401, which may be referred to as "sockets" (not shown). Sockets may provide conductive paths between levels or layers of the memory tile 400, such as between adjacent levels (e.g., between a routing level 420 and an array level 410) or between non-adjacent levels (e.g., between an array level 410 and a circuit level 450). In various examples, sockets may be located within the illustrative boundary of the memory tile 400 (e.g., in a top view), or outside the illustrative boundary of the memory tile 400 (e.g., between memory tiles), or both.

As illustrated by the top view 451 of the circuit level 450, not all of the area of the circuit level 450 of the memory tile 400 is occupied by the circuitry primarily associated with the memory tile 400 (e.g., the word line decoder portions 460, word line driver portions 465, digit line decoder portions 470, and digit line driver portions 475, collectively). Rather, the circuit level 450 also includes an area 480 that is available for other purposes. In some examples, a plurality of memory tiles 400 (e.g., a section of memory tiles 400, a quilt of memory tiles 400) may be associated with a data path 350, and circuitry associated with the data path 350 may be distributed across the respective areas 480 of the plurality of memory tiles 400.

Figure 5:
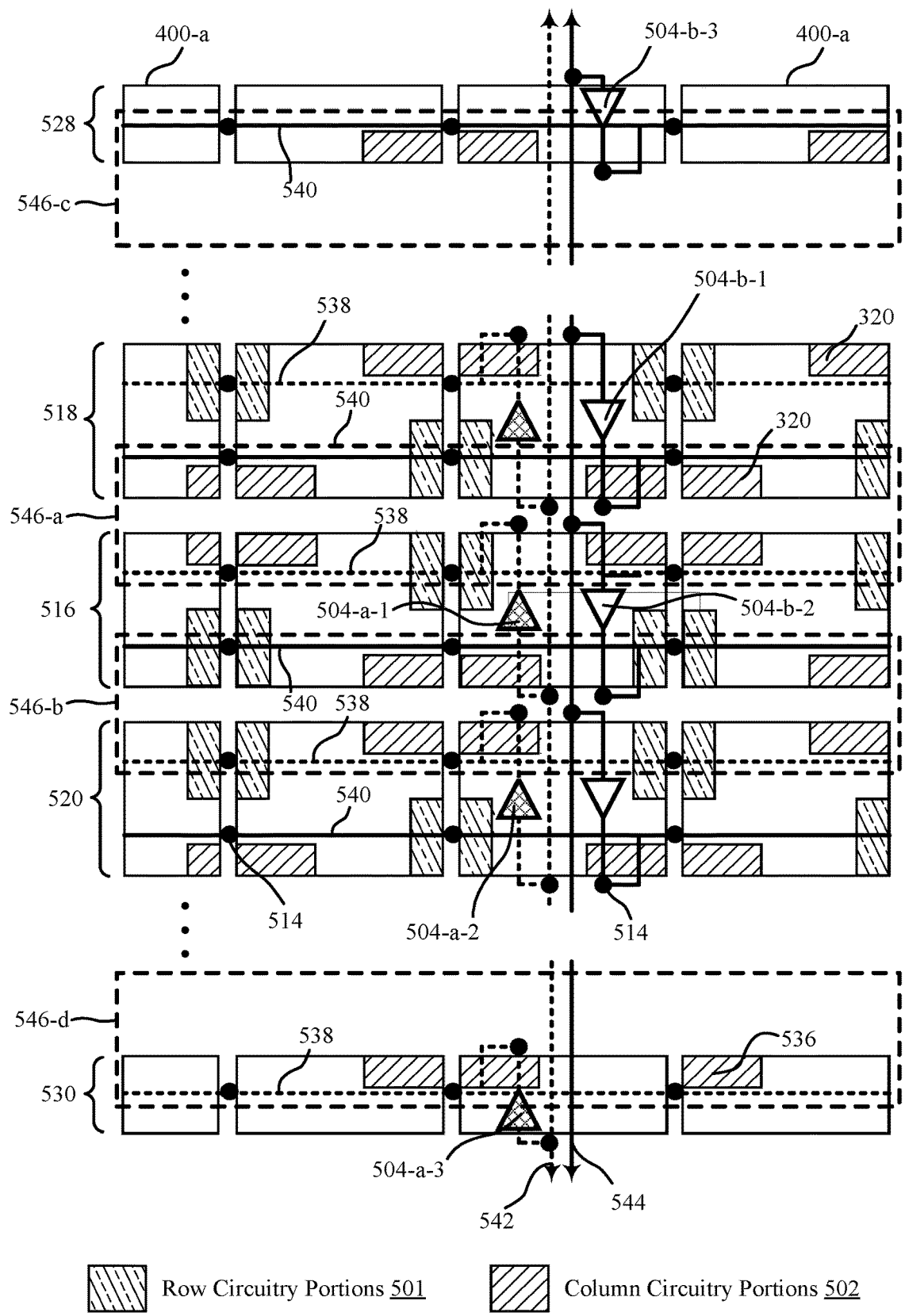
FIG. 5 illustrates an example of a memory array that supports circuitry borrowing in accordance with examples as disclosed herein.

FIG. 5 illustrates an example of a memory array 500 that supports circuitry borrowing for memory arrays in accordance with examples as disclosed herein. The memory array 500 includes memory tiles 400-a that may be arranged in memory sections (e.g., section 516, section 518, section 520). The memory array 500 may have any number of tiles and sections of tiles. The memory array 500 in FIG. 5 is shown in a top down view for purposes of illustrating shared or borrowed circuitry for memory sections 516, 518, 520. Each memory tile 400-a may have various levels or layers (e.g., circuit level, array level, routing level) in a layout. For example, each of the memory tiles 400-a may include an array level 410-a and a circuit level 450-a. In some cases, for each memory tile 400-a, the array level 410-a includes a respective memory subarray that comprises a respective set of memory cells, a respective set of row decoding circuitry, and a respective set of column decoding circuitry. The circuit level 450, as depicted in FIG. 5, may include circuitry corresponding to operating memory cells of the array level 410-a, such as sensing circuitry or other circuitry that is specific to the memory tile 400-a. Additional examples of various levels or layers and their potential configurations are described in more detail in FIG. 4.

The memory array 500 may include multiple sections and multiple sets of shared circuitry. For example, the memory array 500 may include row circuitry portions 501 and column circuitry portions 502, shown as rectangular areas of respective memory tiles 400-a for illustrative purposes. The row circuitry portions 501 may include or otherwise refer to circuitry such as word line decoder portions 460, word line driver portions 465, or both, and the column circuitry portions 502 may include or otherwise refer to circuitry such as digit line decoder portions 470, digit line driver portions 475, or both, as described with reference to FIG. 4. In some examples, portions of one or more row circuitry portions 501, column circuitry portions 502, or both, may be included in a set of shared circuitry 546. In some examples, a set of shared circuitry 546 may include sense amplifier arrays 320 (e.g., sets of sense amplifiers 325) or other components that are shared or "borrowed" by neighboring memory tiles 400 or sections (e.g., first section 516, second section 518, third section 520) in a memory array 500. In some cases, each set of shared circuitry 546 may be shared by two memory sections. Referring to FIG. 5, the first section 516 and the second section 518 can share shared circuitry 546-a, and the first section 516 and the third section 520 can share shared circuitry 546-b, as described in more detail below.

Control signal drivers (e.g., drivers 504-a-1, 504-a-2, 504-b-1, and 504-b-2), which may, in some cases, alternatively be referred to as buffers, are used to drive shared circuitry 546 in a given memory section. The drivers may also be located below an array level 410, memory section, or at a memory tile "bottom side" of the memory tile 400-*a* (e.g., in a circuitry level 450). In some cases, each driver illustrated in FIG. 5 represents one or more drivers. A memory controller or control bus 266 may be coupled with sets of drivers and configured to provide control signals to each set of drivers. The drivers 504 output control signals for the shared circuitry 546 through interconnections or conductive lines 538 and 540 and related sockets 514. For example, the drivers 504 may output or otherwise control the timing signals (e.g., phases) for the sense amplifiers 325 included in a set of shared circuitry 546. In some cases, a set of drivers may be common to memory tiles 400 within a respective memory section of memory tiles 400 and coupled to a set of shared circuitry by the sockets 514.

In some cases, each section may have (correspond to, be above or below) a set of drivers, and the drivers may be split into two groups (or types). The memory array 500 has sets of shared circuitry 546 for memory sections which are operated using some control signals borrowed from a memory section above and some control signals borrowed from a memory section below. For example, a set of shared circuitry 546-*a* may be shared by the first section 516 and a second section 518 located above the first section 516. The set of shared circuitry 546-*a* may be operated by drivers of the first type 504-*a*-1 (corresponding to the first section 516) and drivers of the second type 504-*b*-1 (corresponding to the second section 518). As another example, a set of shared circuitry 546-*b* may be shared by the first section 516 and a third section 520 located below the first section 516. The set of shared circuitry 546-*b* may be operated by drivers of the first type 504-*a*-2 (corresponding to the third section 520) and drivers of the second type 504-*b*-2 (corresponding to the first section 516).

When an access operation is performed on memory cells in section 516, aspects of both the set of shared circuitry 546-*a* and the set of shared circuitry 546-*b* may be used, and thus each of the drivers 504-*a*-1, 504-*a*-2, 504-*b*-1, 504-*b*-2 may be used. That is, when an access operation is performed on memory cells in a section, drivers associated with the section, drivers associated with a first (above) neighboring section, and drivers associated with a second (below) neighboring section may be utilized. In some cases, at least two types of drivers may be used. Drivers of a first type may be borrowed from the above neighboring section and used in conjunction with drivers of a second type from accessed section to operate circuitry shared by (e.g., common to) the accessed section and the above neighboring section. Drivers of the second type may be borrowed from the below neighboring section and used in conjunction with drivers of the first type from the accessed section to operate circuitry shared by (e.g., common to) the accessed section and the below neighboring section. This pattern of driver grouping (e.g., into types, categories, which may be based on the signals generated or output thereby) may repeat across any number of sections, though may be illustrated in FIG. 5 in the context of fewer representative sections for clarity.

In some cases, each set of drivers may occupy a respective area that overlaps the respective memory section. In some cases, each set of drivers may be included in one or more respective memory tiles of the respective memory section. The respective drivers of the first type (e.g., driver 504-*a*-1 and driver 504-*a*-2) output control signals of a first type. The respective drivers of the second type (e.g., driver 504-*b*-1 and driver 504-*b*-2) output control signals of a second type.

The control signals of the first type may relate to a first set of functions or components of a set of shared circuitry 546, and the control signals of the second type may relate to a second set of functions or components of the set of shared circuitry 546. For example, the control signals of the first type may comprise timing signals for a first set of functions performed by each set of shared circuitry 546, and the control signals of the second type may comprise timing signals for a second set of functions performed by each set of shared circuitry 546. The first set of functions or components may be independent of the second set of functions or components, and thus the control signals of the first type may be independent of the control signals of the second type.

The sets of shared circuitry 546 may include sets of data path circuitry (e.g., circuitry of a data path 350) that transfer information associated with access operations for memory cells included in the respective memory sections (e.g., first memory section 516, second memory section 518). The data path circuitry may be shared by memory tiles (e.g., corresponding to operating the memory tiles, corresponding to data exchange between the memory tiles and an input/output component), and may be distributed across the circuit layer 450 of two or more memory tiles. As shown in FIG. 5, conductive lines 542 and 544 may route (carry) signals from the controller to the driver inputs for the drivers 504). Conductive lines 538 and 540 may route (carry) signals from the outputs of the drivers 504 to a shared circuitry. Accessing the memory cells 205-*a* within a memory tile 400-*a* may be controlled through a row decoder (e.g., a respective row circuitry portion 501, a respective word line decoder portion 460) and column decoder (e.g., a respective column circuitry portion 502, a respective column decoder portion 470), which may be coupled with, include, or otherwise be associated with one or more sense amplifier arrays 320.

As shown in FIG. 5, one or more sockets 514 (e.g., vias, conductive plugs) may provide interconnections (e.g., route or carry signals) between components at different layers or levels of a memory tile 400. The sockets 514 may be located between memory tiles 400 within the array 500 (e.g., in gaps between different memory tiles 400). For example, sockets 514 may provide interconnections of the data path circuitry between sense amplifiers 325 (e.g., of sense amplifier arrays 320) and control signal drivers (e.g., drivers 504-*a*-1, 504-*a*-2, 504-*b*-1, 504-*b*-2). The sense amplifiers 325 are each configured to sense logic states stored by memory cells included in a respective first memory section (e.g., memory section 516) and memory cells included in a respective second memory section (e.g., memory section 518).

In some cases, an additional driver of the second type 504-*b*-3 may correspond to a first edge section 528 of the memory array. In some cases, the additional driver of the second type 504-*b*-3 may be coupled with a set of shared circuitry 546-*c* that is common to a first edge section 528 and another memory section (not shown) that is adjacent to the first edge section 528. For example, as each memory section may correspond to two sets of shared circuitry 546—one shared with the memory section above, and one shared with the memory section below—the memory section adjacent to the first edge section 528 may have no above memory section to share with, and hence first edge section 528 may include or otherwise correspond to components that would otherwise be shared with an above section. For example, first edge section 528 may include or otherwise correspond to (e.g., overlap in area with, be above or below) aspects of the set of shared circuitry 546-*c*. As another example, first edge section 528 may include or otherwise correspond to the additional driver of the second type 504-*b*-3, which may support operating the set of shared circuitry 546-*c* when accessing the memory section adjacent to the first edge section 528.

In some cases, the first edge section 528 may lack (e.g., not include, be devoid of) one or more components included in other memory sections (e.g., memory sections 516, 518, 520) but not used to support operating the set of shared circuitry 546-*c* or otherwise shared with the memory section below. For example, the first edge section 528 may include no memory cells.

In some cases, an additional driver of the second type 504-*a*-3 may correspond to a second edge section 530 of the memory array. In some cases, the additional driver of the second type 504-*a*-3 may be coupled with a second set of shared circuitry 546-*d* that is common to the second edge section 530 and a second memory section (not shown) that is adjacent to the second edge section 530. For example, as each memory section may correspond to two sets of shared circuitry 546—one shared with the memory section above, and one shared with the memory section below—the memory section adjacent to the second edge section 530 may have no above memory section to share with, and hence the second edge section 530 may include or otherwise correspond to components that would otherwise be shared with an above section. For example, the second edge section 530 may include or otherwise correspond to (e.g., overlap in area with, be above or below) aspects of the set of shared circuitry 546-*d*. As another example, the second edge section 530 may include or otherwise correspond to the additional driver of the second type 504-*a*-3, which may support operating the set of shared circuitry 546-*d* when accessing the memory section adjacent to the second edge section 530.

In some cases, the second edge section 530 may lack (e.g., not include, be devoid of) one or more components included in other memory sections (e.g., memory sections 516, 518, 520) but not used to support operating the set of shared circuitry 546-*d* or otherwise shared with the memory section below. For example, the second edge section 530 may include no memory cells.

As shown in FIG. 5, in some cases, the first edge section 528 may occupy an area that does not overlap with any drivers of the first type (e.g., no drivers 504-*a*), and the second edge section 530 may occupy an area that does not overlap with any drivers of the second type (e.g., no drivers 504-*b*). In some cases, the additional drivers of the second type 504-*b* may be located under the first edge section 528. In some cases, the additional drivers of the first type 504-*a* may be located under the second edge section 530.

As a result of the shared or borrowed circuitry described herein, there are not drivers of both types 504-*a* and 504-*b* at the edge section 528 or at the edge section 530 of the memory array 500. Instead, only drivers of one borrowed type are at the first edge section 528, and only drivers of another borrowed type are at the second edge section 530. Therefore, space is saved in the edge memory tiles of the memory array 500 (see driver 504-*b*-3 at the edge section 528 of the array 500 and driver 504-*a*-3 at the edge section 530 of the array 500).

Figure 6:
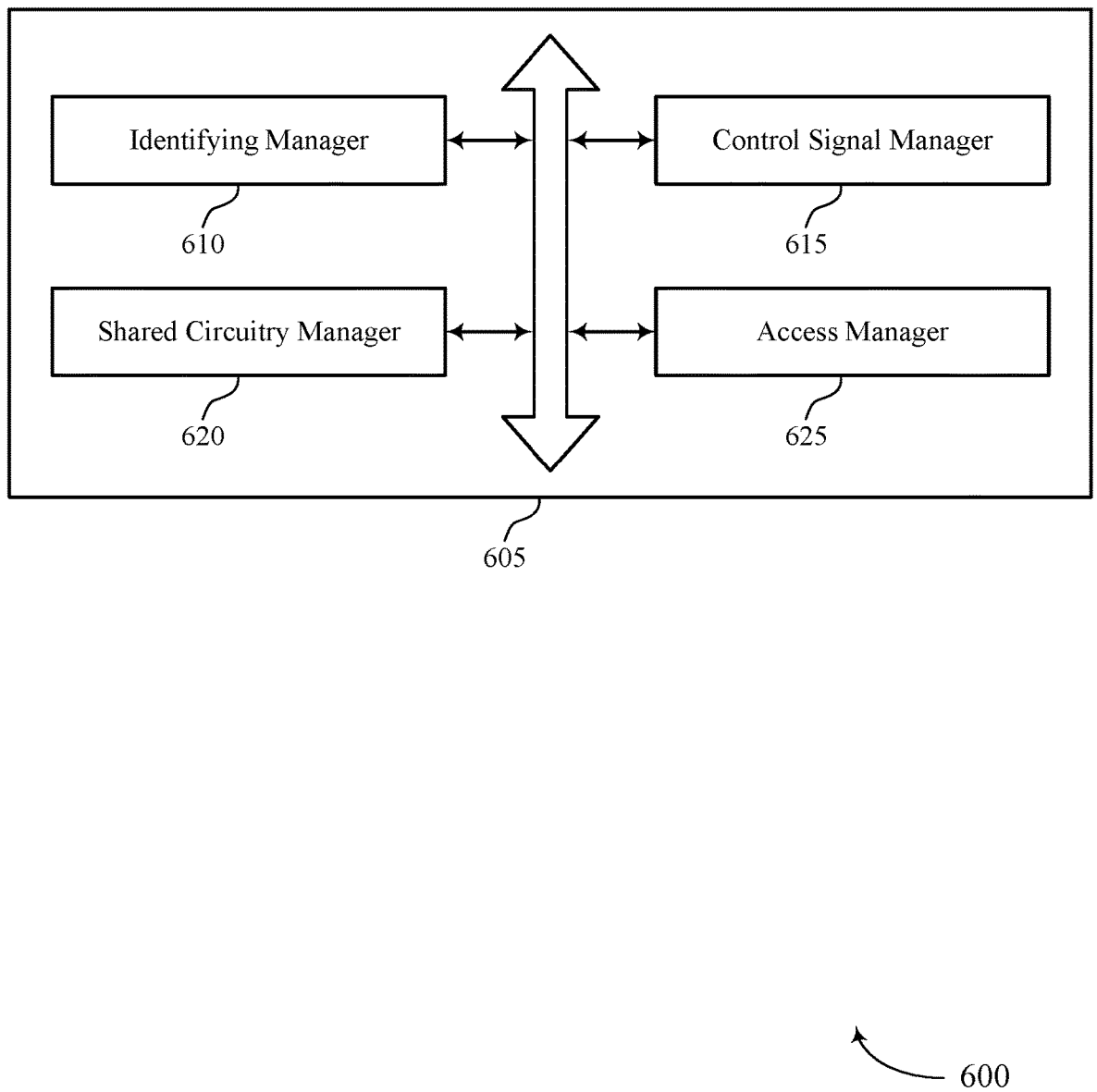
FIG. 6 illustrates an example block diagram 600 of a memory device 605 that supports circuitry borrowing for memory arrays as disclosed herein.

FIG. 6 shows a block diagram 600 of a memory device 605 that supports circuitry borrowing for memory arrays in accordance with examples as disclosed herein. The memory device 605 may be an example of aspects of a memory device as described with reference to FIGS. 1-5. The memory device 605 may include an identifying manager 610, a control signal manager 615, a shared circuitry manager 620, and an access manager 625. Each of these modules may communicate, directly or indirectly, with one another (e.g., via one or more buses).

The identifying manager 610 may identify a first memory section of a memory array for an access operation. The first memory section may be located between a second memory section of the memory array and a third memory section of the memory array.

The control signal manager 615 may generate control signals of a first type using a first set of drivers associated with the first memory section. In some examples, the control signal manager 615 may generate control signals of a second type using a second set of drivers associated with the first memory section.

In some examples, the control signal manager 615 may generate additional control signals of the second type using the drivers associated with the second memory section. In some examples, the control signal manager 615 may generate additional control signals of the first type using the drivers associated with the third memory section. In some cases, the control signal manager 615 may generate additional control signals of the second type using a third set of drivers associated with the second memory section. In some examples, the control signal manager 615 may generate additional control signals of the first type using a fourth set of drivers associated with the third memory section.

In some examples, the control signal manager 615 may couple the first subset of the drivers associated with the first memory section and the drivers associated with the second memory section with the first set of circuitry based on identifying the first memory section for the access operation.

In some examples, the control signal manager 615 may couple the second subset of the drivers associated with the first memory section and the drivers associated with the third memory section with the second set of circuitry based on identifying the first memory section for the access operation. The shared circuitry manager 620 may operate a first set of circuitry shared by the first memory section and the second memory section using drivers associated with the first memory section and drivers associated with the second memory section based on identifying the first memory section for the access operation.

In some examples, the shared circuitry manager 620 may operate a second set of circuitry shared by the first memory section and the third memory section using drivers associated with the first memory section and drivers associated with the third memory section based on identifying the first memory section for the access operation.

In some examples, the shared circuitry manager 620 may perform a first set of functions based on the control signals of the first type and a second set of functions based on the additional control signals of the second type using the first set of circuitry.

In some examples, performing the access operation includes performing the first set of functions and the second set of functions. In some cases, the first set of functions are independent of the second set of functions.

In some cases, the first set of circuitry includes a first set of sense amplifiers, a first subset of the first set of sense amplifiers underlying memory tiles of the first memory section, and a second subset of the first set of sense amplifiers underlying memory tiles of the second memory section. In some cases, the second set of circuitry includes a second set of sense amplifiers, a first subset of the second set of sense amplifiers underlying memory tiles of the first memory section, and a second subset of the second set of sense amplifiers underlying memory tiles of the third memory section.

The shared circuitry manager 620 may operate a first set of sense amplifiers using the control signals of the first type generated by the first set of drivers and the additional control signals of the second type generated by the third set of drivers.

In some examples, the shared circuitry manager 620 may operate a second set of sense amplifiers using the additional control signals of the first type generated by the fourth set of drivers and the control signals of the second type generated by the second set of drivers.

In some cases, a first subset of the first set of circuitry is included in memory tiles within the first memory section. In some cases, a second subset of the first set of circuitry is included in memory tiles within the second memory section.

In some cases, the drivers associated with the first memory section are included in one or more memory tiles within the first memory section. In some cases, the drivers associated with the second memory section are included in one or more memory tiles within the second memory section. In some cases, the drivers associated with the third memory section are included in one or more memory tiles within the second memory section.

The access manager 625 may perform the access operation based on operating the first set of sense amplifiers and operating the second set of sense amplifiers.

Figure 7:
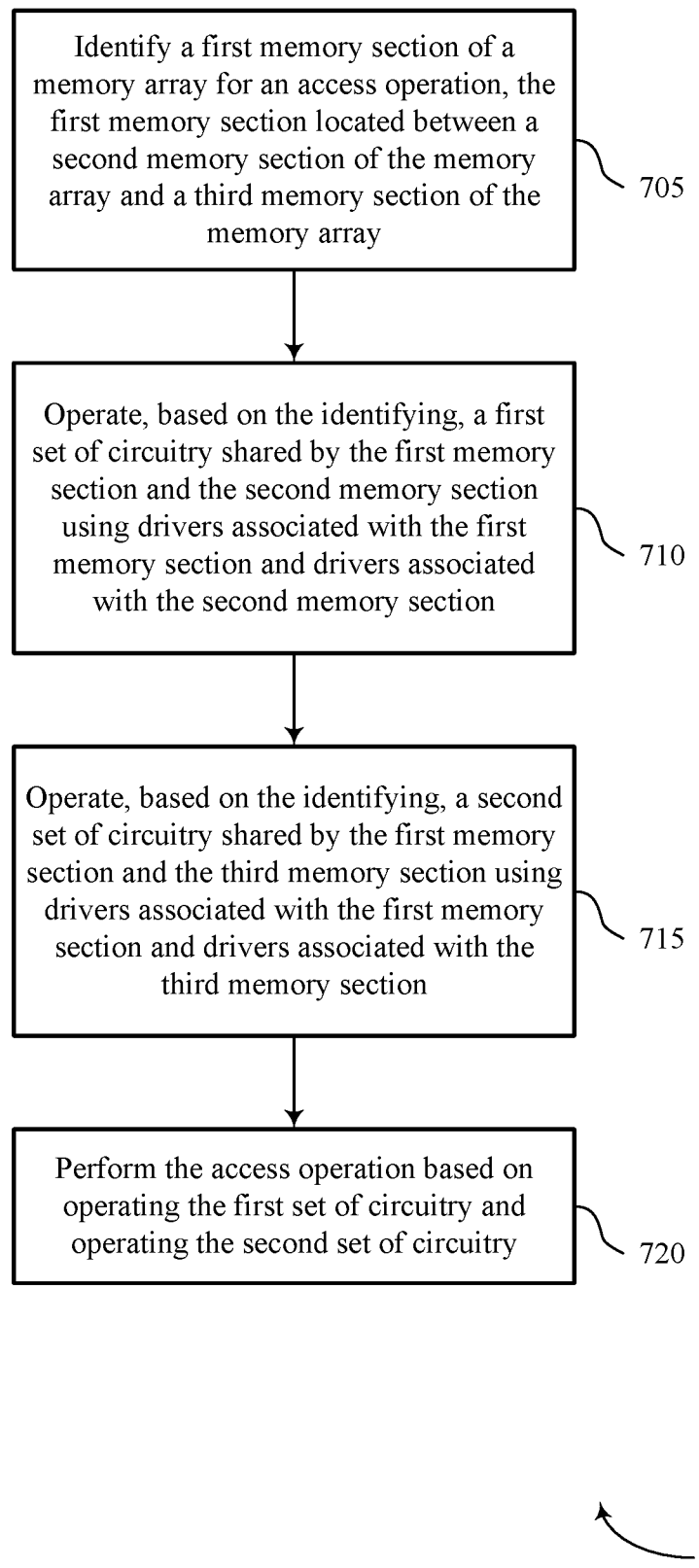
FIG. 7 illustrates an example of a flowchart illustrating a method that supports circuitry borrowing for memory arrays in accordance with examples as disclosed herein.

FIG. 7 shows a flowchart illustrating a method or methods 700 that supports circuitry borrowing for memory arrays in accordance with aspects of the present disclosure. The operations of method 700 may be implemented by a memory device or its components as described herein. For example, the operations of method 700 may be performed by a memory device as described with reference to FIGS. 1-6. In some examples, a memory device may execute a set of instructions to control the functional elements of the memory device to perform the described functions. Additionally, or alternatively, a memory device may perform aspects of the described functions using special-purpose hardware.

At 705, the memory device may identify a first memory section of a memory array for an access operation, the first memory section located between a second memory section of the memory array and a third memory section of the memory array. The operations of 705 may be performed according to the methods described herein. In some examples, aspects of the operations of 705 may be performed by an access manager as described with reference to FIG. 6.

At 710, the memory device may operate, based on the identifying, a first set of circuitry shared by the first memory section and the second memory section using drivers associated with the first memory section and drivers associated with the second memory section. The operations of 710 may be performed according to the methods described herein. In some examples, aspects of the operations of 710 may be performed by a shared circuitry manager as described with reference to FIG. 6.

At 715, the memory device may operate, based on the identifying, a second set of circuitry shared by the first memory section and the third memory section using drivers associated with the first memory section and drivers associated with the third memory section. The operations of 715 may be performed according to the methods described herein. In some examples, aspects of the operations of 815 may be performed by a shared circuitry manager as described with reference to FIG. 6.

At 720, the memory device may perform the access operation based on operating the first set of circuitry and operating the second set of circuitry. The operations of 720 may be performed according to the methods described herein. In some examples, aspects of the operations of 720 may be performed by an access manager as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for identifying a first memory section of a memory array for an access operation, the first memory section located between a second memory section of the memory array and a third memory section of the memory array, operating, based on the identifying, a first set of circuitry shared by the first memory section and the second memory section using drivers associated with the first memory section and drivers associated with the second memory section, operating, based on the identifying, a second set of circuitry shared by the first memory section and the third memory section using drivers associated with the first memory section and drivers associated with the third memory section, and performing the access operation based on operating the first set of circuitry and operating the second set of circuitry.

Some examples of the method 700 and the apparatus described herein may further include operations, features, means, or instructions for generating control signals of a first type using a first subset of the drivers associated with the first memory section, generating control signals of a second type using a second subset of the drivers associated with the first memory section, generating additional control signals of the second type using the drivers associated with the second memory section, and generating additional control signals of the first type using the drivers associated with the third memory section.

Some examples of the method 700 and the apparatus described herein may further include operations, features, means, or instructions for coupling, based on the identifying, the first subset of the drivers associated with the first memory section and the drivers associated with the second memory section with the first set of circuitry, and coupling, based on the identifying, the second subset of the drivers associated with the first memory section and the drivers associated with the third memory section with the second set of circuitry.

Some examples of the method 700 and the apparatus described herein may further include operations, features, means, or instructions for performing, using the first set of circuitry, a first set of functions based on the control signals of the first type and a second set of functions based on the additional control signals of the second type, and where performing the access operation includes performing the first set of functions and the second set of functions. In some examples of the method 700 and the apparatus described herein, the first set of functions may be independent of the second set of functions.

In some examples of the method 700 and the apparatus described herein, the first set of circuitry includes a first set of sense amplifiers, a first subset of the first set of sense amplifiers underlying memory tiles of the first memory section and a second subset of the first set of sense amplifiers underlying memory tiles of the second memory section, and the second set of circuitry includes a second set of sense amplifiers. A first subset of the second set of sense amplifiers may underlie memory tiles of the first memory section and a second subset of the second set of sense amplifiers may underlie memory tiles of the third memory section.

In some examples of the method 700 and the apparatus described herein, a first subset of the first set of circuitry may be included in memory tiles within the first memory section, and a second subset of the first set of circuitry may be included in memory tiles within the second memory section.

In some examples of the method 700 and the apparatus described herein, the drivers associated with the first memory section may be included in one or more memory tiles within the first memory section, the drivers associated with the second memory section may be included in one or more memory tiles within the second memory section, and the drivers associated with the third memory section may be included in one or more memory tiles within the second memory section.

Figure 8:
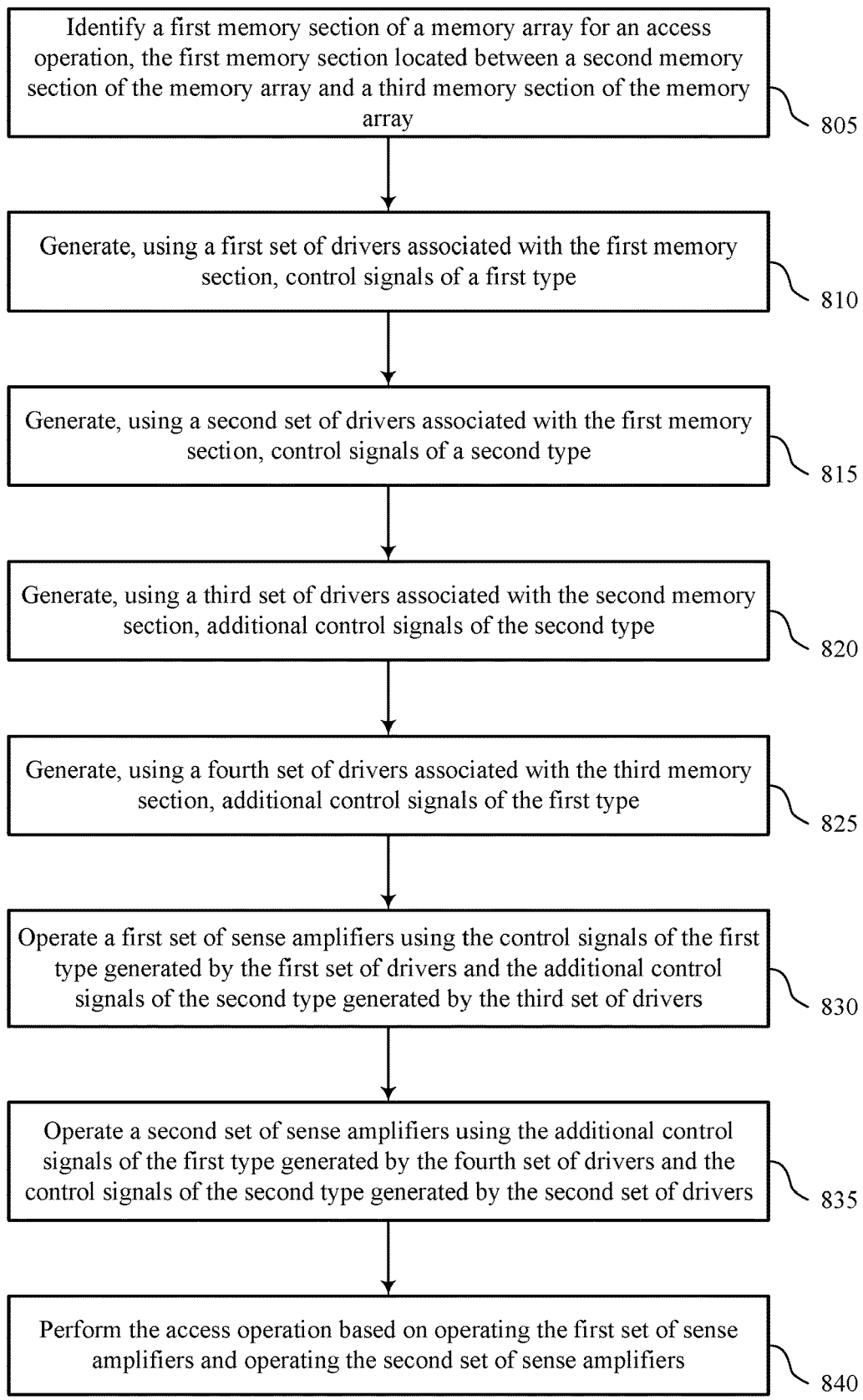
FIG. 8 illustrates an example of a flowchart illustrating a method that supports circuitry borrowing for memory arrays in accordance with examples as disclosed herein.

FIG. 8 shows a flowchart illustrating a method or methods 800 that supports circuitry borrowing for memory arrays in accordance with aspects of the present disclosure. The operations of method 800 may be implemented by a memory device or its components as described herein. For example, the operations of method 800 may be performed by a memory device as described with reference to FIGS. 1-6. In some examples, a memory device may execute a set of instructions to control the functional elements of the memory device to perform the described functions. Additionally, or alternatively, a memory device may perform aspects of the described functions using special-purpose hardware.

At 805, the memory device may identify a first memory section of a memory array for an access operation, the first memory section located between a second memory section of the memory array and a third memory section of the memory array. The operations of 805 may be performed according to the methods described herein. In some examples, aspects of the operations of 805 may be performed by an identifying manager as described with reference to FIG. 6.

At 810, the memory device may generate, using a first set of drivers associated with the first memory section, control signals of a first type. The operations of 810 may be performed according to the methods described herein. In some examples, aspects of the operations of 810 may be performed by a control signal manager as described with reference to FIG. 6.

At 815, the memory device may generate, using a second set of drivers associated with the first memory section, control signals of a second type. The operations of 915 may be performed according to the methods described herein. In some examples, aspects of the operations of 815 may be performed by a control signal manager as described with reference to FIG. 6.

At 820, the memory device may generate, using a third set of drivers associated with the second memory section, additional control signals of the second type. The operations of 820 may be performed according to the methods described herein. In some examples, aspects of the operations of 820 may be performed by a control signal manager as described with reference to FIG. 6.

At 825, the memory device may generate, using a fourth set of drivers associated with the third memory section, additional control signals of the first type. The operations of 825 may be performed according to the methods described herein. In some examples, aspects of the operations of 825 may be performed by a control signal manager as described with reference to FIG. 6.

At 830, the memory device may operate a first set of sense amplifiers using the control signals of the first type generated by the first set of drivers and the additional control signals of the second type generated by the third set of drivers. The operations of 830 may be performed according to the methods described herein. In some examples, aspects of the operations of 830 may be performed by a shared circuitry manager as described with reference to FIG. 6.

At 835, the memory device may operate a second set of sense amplifiers using the additional control signals of the first type generated by the fourth set of drivers and the control signals of the second type generated by the second set of drivers. The operations of 835 may be performed according to the methods described herein. In some examples, aspects of the operations of 835 may be performed by a shared circuitry manager as described with reference to FIG. 6.

At 840, the memory device may perform the access operation based on operating the first set of sense amplifiers and operating the second set of sense amplifiers. The operations of 840 may be performed according to the methods described herein. In some examples, aspects of the operations of 840 may be performed by an access manager as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for identifying a first memory section of a memory array for an access operation, the first memory section located between a second memory section of the memory array and a third memory section of the memory array, generating, using a first set of drivers associated with the first memory section, control signals of a first type, generating, using a second set of drivers associated with the first memory section, control signals of a second type, generating, using a third set of drivers associated with the second memory section, additional control signals of the second type, generating, using a fourth set of drivers associated with the third memory section, additional control signals of the first type, operating a first set of sense amplifiers using the control signals of the first type generated by the first set of drivers and the additional control signals of the second type generated by the third set of drivers, operating a second set of sense amplifiers using the additional control signals of the first type generated by the fourth set of drivers and the control signals of the second type generated by the second set of drivers, and performing the access operation based on operating the first set of sense amplifiers and operating the second set of sense amplifiers.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array comprising a plurality of memory sections, a plurality of sets of shared circuitry that are each common to a respective first memory section of the plurality and a respective second memory section of the plurality and a plurality of sets of drivers that each correspond to a respective memory section of the plurality. Each set of drivers of the plurality may include respective drivers of a first type coupled with a respective first set of shared circuitry of the plurality that is common to the respective memory section and a first other memory section of the plurality, and respective drivers of a second type coupled with a respective second set of shared circuitry of the plurality that is common to the respective memory section and a second other memory section of the plurality.

Some examples of the apparatus may include an additional driver of the first type corresponding to a first edge section at a first edge of the memory array, where the additional driver of the first type may be coupled with a first set of shared circuitry of the set that may be common to the first edge section and a first memory section of the set, and an additional driver of the second type corresponding to a second edge section at a second edge of the memory array, where the additional driver of the second type may be coupled with a second set of shared circuitry of the set that may be common to the second edge section and a second memory section of the set.

In some examples, the first edge section occupies an area that does not overlap with any drivers of the second type, and the second edge section occupies an area that does not overlap with any drivers of the first type.

In some examples, the additional drivers of the first type may be located under the first edge section, and the additional drivers of the second type may be located under the second edge section.

In some examples, each set of drivers of the set occupies a respective area that overlaps the respective memory section.

In some examples, each memory section of the set includes respective memory tiles, and each set of drivers of the set may be included in one or more of the respective memory tiles of the respective memory section.

In some examples, each memory tile of the respective set of memory tiles includes a respective memory subarray that includes a respective set of memory cells, a respective set of row decoding circuitry, and a respective set of column decoding circuitry.

In some examples, the set of sets of shared circuitry include sets of sense amplifiers that may be each configured to sense logic states stored by memory cells included in the respective first memory section and memory cells included in the respective second memory section.

In some examples, the set of sets of shared circuitry include sets of data path circuitry that may be each configured to transfer information associated with access operations for memory cells included in the respective first memory section and memory cells included in the respective second memory section.

In some examples, the respective drivers of the first type may be configured to output control signals of a first type, and the respective drivers of the second type may be configured to output control signals of a second type.

In some examples, the control signals of the first type include timing signals for a first set of functions performed by each set of shared circuitry, and the control signals of the second type include timing signals for a second set of functions performed by each set of shared circuitry.

In some examples, the first set of functions may be independent of the second set of functions.

Some examples of the apparatus may include a memory controller coupled with the set of sets of drivers and configured to provide control signals to each set of drivers of the set.

An apparatus is described. The apparatus may include a memory array including a first memory section located between a second memory section and a third memory section. A first set of circuitry may be configured to be selectively coupled with the first memory section and the second memory section. A second set of circuitry may be configured to be selectively coupled with the first memory section and the third memory section. A first set of drivers may be associated with the first memory section, where a first subset of the first set of drivers is configured to generate control signals of a first type for the first set of circuitry and a second subset of the first set of drivers is configured to generate control signals of a second type for the second set of circuitry. A second set of drivers may be associated with the second memory section, where a subset of the second set of drivers is configured to generate control signals of the second type for the first set of circuitry, and a third set of drivers associated with the third memory section, where a subset of the third set of drivers is configured to generate control signals of the first type for the second set of circuitry.

In some examples, the first set of circuitry occupies an area that overlaps the first memory section and the second memory section, and the second set of circuitry occupies an area that overlaps the first memory section and the third memory section.

In some examples, the first set of drivers occupies an area that overlaps the first memory section, the second set of drivers occupies an area that overlaps the second memory section, and the third set of drivers occupies an area that overlaps the third memory section.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples' other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory array comprising a plurality of memory sections;

a plurality of sets of shared circuitry; and
a plurality of sets of drivers that each corresponds to a respective memory section of the plurality, wherein each set of drivers of the plurality comprises:
respective drivers of a first type coupled with a respective first set of shared circuitry of the plurality that is common to a first memory section and a second section of the plurality; and
respective drivers of a second type coupled with a respective second set of shared circuitry of the plurality that is common to the first memory section and a third memory section of the plurality, wherein the drivers of the first type do not drive the respective second set of shared circuitry.

2. The apparatus of claim 1, further comprising:
an additional driver of the first type corresponding to a first edge section at a first edge of the memory array, wherein the additional driver of the first type is coupled with a first set of shared circuitry of the plurality that is common to the first edge section and a first memory section of the plurality; and
an additional driver of the second type corresponding to a second edge section at a second edge of the memory array, wherein the additional driver of the second type is coupled with a second set of shared circuitry of the plurality that is common to the second edge section and a second memory section of the plurality.

3. The apparatus of claim 2, wherein:
the first edge section occupies an area that does not overlap with any drivers of the second type; and
the second edge section occupies an area that does not overlap with any drivers of the first type.

4. The apparatus of claim 2, wherein:
the additional driver of the first type is located under the first edge section; and
the additional driver of the second type is located under the second edge section.

5. The apparatus of claim 1, wherein:
each set of drivers of the plurality occupies a respective area that overlaps the respective memory section.

6. The apparatus of claim 1, wherein:
each memory section of the plurality comprises respective memory tiles;
each set of drivers of the plurality is included in one or more of the respective memory tiles of the respective memory section.

7. The apparatus of claim 6, wherein:
each memory tile of the respective memory tiles comprises a respective memory subarray that comprises a respective set of memory cells, a respective set of row decoding circuitry, and a respective set of column decoding circuitry.

8. The apparatus of claim 6, wherein:
the plurality of sets of shared circuitry comprise a plurality of sets of sense amplifiers that are each configured to sense logic states stored by memory cells included in two or more memory sections of the plurality of memory sections.

9. The apparatus of claim 6, wherein:
the plurality of sets of shared circuitry comprise a plurality of sets of data path circuitry that are each configured to transfer information associated with access operations for memory cells included in two or more memory sections of the plurality of memory sections.

10. The apparatus of claim 1, wherein:
the respective drivers of the first type are configured to output control signals of a first type; and
the respective drivers of the second type are configured to output control signals of a second type.

11. The apparatus of claim 10, wherein:
the control signals of the first type comprise timing signals for a first set of functions performed by each set of shared circuitry; and
the control signals of the second type comprise timing signals for a second set of functions performed by each set of shared circuitry.

12. The apparatus of claim 11, wherein:
the first set of functions are independent of the second set of functions.

13. The apparatus of claim 1, further comprising:
a memory controller coupled with the plurality of sets of drivers and configured to provide control signals to each set of drivers of the plurality.

14. An apparatus comprising:
a memory array comprising a first memory section located between a second memory section and a third memory section;
a first set of circuitry configured to be selectively coupled with the first memory section and the second memory section;
a second set of circuitry configured to be selectively coupled with the first memory section and the third memory section;
a first set of drivers, comprising a first subset and second subset of drivers, associated with the first memory section, and a second set of drivers associated with the second memory section, wherein the first subset of drivers, the second subset of drivers, and a subset of drivers in the second set of drivers are configured to generate, respectively, control signals of a first type, a second type, and the second type for the first set of circuitry, the second set of circuitry, and the first set of circuitry, respectively; and
a third set of drivers associated with the third memory section, wherein a subset of the third set of drivers is configured to generate control signals of the first type for the second set of circuitry, wherein the first subset of drivers do not drive the second set of circuitry.

15. The apparatus of claim 14, wherein:
the first set of circuitry occupies an area that overlaps the first memory section and the second memory section; and
the second set of circuitry occupies an area that overlaps the first memory section and the third memory section.

16. The apparatus of claim 14, wherein:
the first set of drivers occupies an area that overlaps the first memory section;
the second set of drivers occupies an area that overlaps the second memory section; and
the third set of drivers occupies an area that overlaps the third memory section.

17. A method, comprising:
identifying a first memory section of a memory array tor an access operation, the first memory section located between a second memory section of the memory array and a third memory section of the memory array;
operating, based at least in part on the identifying, a first set of circuitry configured to be used by the first memory section and the second memory section, wherein operating the first set of circuitry comprises using drivers associated with the first memory section and drivers associated with the second memory section;
operating, based at least in part on the identifying, a second set of circuitry configured to be used by the first memory section and the third memory section, wherein operating the second set of circuitry comprises using drivers associated with the first memory section and drivers associated with the third memory section;

performing the access operation based at least in part on operating the first set of circuitry and operating the second set of circuitry;

generating control signals of a first type for controlling the first set of circuitry using a first subset of the drivers associated with the first memory section;

generating control signals of a second type for controlling the second set of circuitry using a second subset of the drivers associated with the first memory section;

generating additional control signals of the second type for controlling the first set of circuitry using a subset of the drivers associated with the second memory section; and generating additional control signals of the first type for controlling the second set of circuitry using a subset of the drivers associated with the third memory section, wherein the first set of circuitry comprises a first set of sense amplifiers and the second set of circuitry comprises a second set of sense amplifiers.

18. The method of claim 17, further comprising; coupling, based at least in part on the identifying, the first subset of the drivers associated with the first memory section and the drivers associated with the second memory section with the first set of circuitry; coupling, based at least in part on the identifying, the second subset of the drivers associated with the first memory section and the drivers associated with the third memory section with the second set of circuitry.

19. The method of claim 17, further comprising:
performing using the first set of circuitry, a first set of functions based at least in part on the control signal of the first type and a second set of functions based at least in part on the additional control signals of the second type,
wherein performing the access operation comprises performing the first set of functions and the second set of functions.

20. The method of claim 19, wherein the first set of functions are independent of the second set of functions.

21. The method of claim 19, wherein:
a first subset of the first set of sense amplifiers is arranged under memory tiles of the first memory section and a second subset of the first set of sense amplifiers is arranged under memory tiles of the second memory section; and a first subset of the second set of sense amplifiers is arranged under memory tiles of the first memory section and a second subset of the second set of sense amplifiers is arranged under memory tiles of the third memory section.

22. The method of claim 19, wherein:
a first subset of the first set of circuitry is included in memory tiles within the first memory section; and
a second subset of the first set of circuitry is included in memory tiles within the second memory section.

23. The method of claim 19, wherein:
the drivers associated with the first memory section are included in one or more memory tiles within the first memory section;
the drivers associated with the second memory section are included in one or more memory tiles within the second memory section; and
the drivers associated with the third memory section are included in one or more memory tiles within the second memory section.

24. A method, comprising:
identifying a first memory section of a memory array for an access operation, the first memory section located between a second memory section of the memory array and a third memory section of the memory array;
generating, using a first set of drivers in a first set of circuitry configured to be used by the first memory section, control signals of a first type;
generating, using a second set of drivers in the first set of circuitry configured to be used by the first memory section, control signals of a second type;
generating, using a third set of drivers in a second set of circuitry configured to be used by the second memory section, additional control signals of the second type;
generating, using a fourth set of drivers in a third set of circuitry configured to be used by the third memory section, additional control signals of the first type;
operating a first set of sense amplifiers using the control signals of the first type generated by the first set of drivers and the additional control signals of the second type generated by the third set of drivers;
operating a second set of sense amplifiers using the additional control signals of the first type generated by the fourth set of drivers and the control signals of the second type generated by the second set of drivers; and
performing the access operation based at least in part on operating the first set of sense amplifiers and operating the second set of sense amplifiers.

* * * * *